(12) United States Patent
Miyanaga et al.

(10) Patent No.: US 10,480,060 B2
(45) Date of Patent: *Nov. 19, 2019

(54) OXIDE SINTERED BODY AND METHOD FOR MANUFACTURING THE SAME, SPUTTERING TARGET, AND SEMICONDUCTOR DEVICE

(71) Applicant: Sumitomo Electric Industries, Ltd., Osaka-shi (JP)

(72) Inventors: Miki Miyanaga, Itami (JP); Kenichi Watatani, Itami (JP); Koichi Sogabe, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/928,769

(22) Filed: Mar. 22, 2018

(65) Prior Publication Data

US 2019/0093211 A1    Mar. 28, 2019

Related U.S. Application Data

(62) Division of application No. 14/787,751, filed as application No. PCT/JP2015/058061 on Mar. 18, 2015, now Pat. No. 9,957,604.

(30) Foreign Application Priority Data

Mar. 25, 2014  (JP) ................................. 2014-061493
Jan. 30, 2015  (JP) ................................. 2015-016695

(51) Int. Cl.
*H01B 1/08*       (2006.01)
*C04B 35/00*      (2006.01)
(Continued)

(52) U.S. Cl.
CPC .......... *C23C 14/3414* (2013.01); *B28B 3/003* (2013.01); *C04B 35/01* (2013.01);
(Continued)

(58) Field of Classification Search
CPC .. H01B 1/00; H01B 1/08; C04B 35/00; C23C 14/00; C23C 14/34; H01L 21/336
See application file for complete search history.

(56) References Cited

U.S. PATENT DOCUMENTS 8,461,583 B2    6/2013  Yano et al.
9,299,791 B2 *  3/2016  Nakayama .............. H01L 29/24
(Continued)

FOREIGN PATENT DOCUMENTS

CN      1690011 A      11/2005
CN      102460712 A    5/2012
(Continued)

OTHER PUBLICATIONS

Notice of Allowance dated Nov. 21, 2018 in U.S. Appl. No. 15/122,448.
(Continued)

*Primary Examiner* — Mark Kopec
(74) *Attorney, Agent, or Firm* — Baker Botts L.L.P.; Michael A. Sartori

(57) ABSTRACT

There is provided an oxide sintered body including indium, tungsten and zinc, wherein the oxide sintered body includes a bixbite type crystal phase as a main component and has an apparent density of higher than 6.5 g/cm³ and equal to or lower than 7.1 g/cm³, a content rate of tungsten to a total of indium, tungsten and zinc is higher than 1.2 atomic % and lower than 30 atomic %, and a content rate of zinc to the total of indium, tungsten and zinc is higher than 1.2 atomic % and lower than 30 atomic %. There are also provided a sputtering target including this oxide sintered body, and a semiconduc-
(Continued)

US 10,480,060 B2

Page 2 tor device including an oxide semiconductor film formed by a sputtering method by using the sputtering target.

7 Claims, 2 Drawing Sheets

(51) Int. Cl.
| | |
|---|---|
| C23C 14/00 | (2006.01) |
| C23C 14/34 | (2006.01) |
| C23C 14/08 | (2006.01) |
| H01L 21/02 | (2006.01) |
| C04B 35/01 | (2006.01) |
| C04B 35/626 | (2006.01) |
| H01L 29/786 | (2006.01) |
| B28B 3/00 | (2006.01) |
| C04B 35/64 | (2006.01) |
| C23C 14/35 | (2006.01) |
| H01L 29/22 | (2006.01) |

(52) U.S. Cl.
CPC .... *C04B 35/6261* (2013.01); *C04B 35/62675* (2013.01); *C04B 35/62685* (2013.01); *C04B 35/64* (2013.01); *C23C 14/08* (2013.01); *C23C 14/35* (2013.01); *H01B 1/08* (2013.01); *H01L 21/02554* (2013.01); *H01L 21/02565* (2013.01); *H01L 21/02631* (2013.01); *H01L 29/22* (2013.01); *H01L 29/7869* (2013.01); *H01L 29/78609* (2013.01); *H01L 29/78681* (2013.01); *C04B 2235/326* (2013.01); *C04B 2235/3217* (2013.01); *C04B 2235/3232* (2013.01); *C04B 2235/3239* (2013.01); *C04B 2235/3241* (2013.01); *C04B 2235/3244* (2013.01); *C04B 2235/3251* (2013.01); *C04B 2235/3256* (2013.01); *C04B 2235/3258* (2013.01); *C04B 2235/3284* (2013.01); *C04B 2235/3286* (2013.01); *C04B 2235/3298* (2013.01); *C04B 2235/3418* (2013.01); *C04B 2235/3427* (2013.01); *C04B 2235/5436* (2013.01); *C04B 2235/5445* (2013.01); *C04B 2235/602* (2013.01); *C04B 2235/6567* (2013.01); *C04B 2235/6583* (2013.01); *C04B 2235/661* (2013.01); *C04B 2235/72* (2013.01); *C04B 2235/76* (2013.01); *C04B 2235/77* (2013.01); *C04B 2235/80* (2013.01)

(56) References Cited

U.S. PATENT DOCUMENTS

| | | | |
|---|---|---|---|
| 9,543,444 B2 | 1/2017 | Kishimoto et al. | |
| 9,957,604 B2 * | 5/2018 | Miyanaga | C23C 14/3414 |
| 2004/0040414 A1 | 3/2004 | Abe | |
| 2005/0239660 A1 | 10/2005 | Abe et al. | |
| 2006/0099140 A1 | 5/2006 | Abe | |
| 2007/0126344 A1 | 6/2007 | Ohashi et al. | |
| 2007/0170434 A1 | 7/2007 | Inoue et al. | |
| 2008/0191204 A1 | 8/2008 | Kim et al. | |
| 2010/0025680 A1 | 2/2010 | Shino et al. | |
| 2010/0276688 A1 | 11/2010 | Yano et al. | |
| 2011/0042669 A1 | 2/2011 | Kim et al. | |
| 2011/0168994 A1 | 7/2011 | Kawashima et al. | |
| 2011/0240935 A1 | 10/2011 | Yano et al. | |
| 2012/0023188 A1 * | 1/2012 | Martin | G06Q 30/0601 709/217 |
| 2012/0037897 A1 | 2/2012 | Shiino et al. | |
| 2013/0299753 A1 | 11/2013 | Nakayama | |
| 2015/0279943 A1 | 10/2015 | Nakayama | |
| 2016/0251264 A1 | 9/2016 | Miyanaga et al. | |
| 2017/0012133 A1 | 1/2017 | Miyanaga et al. | |

| | | | |
|---|---|---|---|
| 2017/0029933 A1 * | 2/2017 | Miyanaga | C04B 35/00 |
| 2017/0062620 A1 | 3/2017 | Yamazaki et al. | |
| 2017/0069474 A1 | 3/2017 | Miyanaga et al. | |

FOREIGN PATENT DOCUMENTS

| | | |
|---|---|---|
| EP | 1 734 150 A1 | 12/2006 |
| EP | 2421048 A1 | 2/2012 |
| EP | 2980041 A1 | 2/2016 |
| JP | 2002-275623 A | 9/2002 |
| JP | 2004-091265 A | 3/2004 |
| JP | 2005-314131 A | 11/2005 |
| JP | 2006-022373 A | 1/2006 |
| JP | 2006-160535 A | 6/2006 |
| JP | 2006-188392 A | 7/2006 |
| JP | 2006-193363 A | 7/2006 |
| JP | 2006-347807 A | 12/2006 |
| JP | 2007-153702 A | 6/2007 |
| JP | 2008-192721 A | 8/2008 |
| JP | 2008-199005 A | 8/2008 |
| JP | 2010-251604 A | 11/2010 |
| JP | 2013-001590 A | 1/2013 |
| JP | 2013-173658 A | 9/2013 |
| JP | 2013-184840 A | 9/2013 |
| KR | 10-2006-0046691 A | 5/2006 |
| TW | 200538395 A | 12/2005 |
| TW | 201615596 A | 5/2016 |
| WO | 2014/058019 A1 | 4/2014 |
| WO | 2012/105323 A1 | 7/2014 |
| WO | 2015/146745 A1 | 10/2015 |

OTHER PUBLICATIONS

Notification of First Office Action in Chinese Patent Application No. 201580000813.3, dated Jun. 2, 2016. [Cited in Parent].
Grounds for Rejection in counterpart Korean Patent Application No. 10-2015-7032831, dated Sep. 22, 2016 [Cited in Parent].
Extended European Search Report in counterpart European Patent Application No. 15768922.5, dated Dec. 13, 2016 [Cited in Parent].
Intenational Search Report in International Application No. PCT/JP2015/079160, dated Dec. 8, 2015 [Cited in Parent].
International Search Report in International Application No. PCT/JP2015/058061, dated Jun. 16, 2015 [Cited in Parent].
International Search Report in PCT International Applicaiton No. PCT/JP2015/060969, dated Jun. 30, 2015 [Cited in Parent].
Extended European Search Report in counterpart European Patent Application No. 15851758.1, dated Nov. 14, 2016 [Cited in Parent].
Notice of Grounds of Rejection in counterpart Japanese Patent Application No. 2014-215468, dated Dec. 20, 2016 [Cited in Parent].
U.S. Appl. No. 15/122,448, filed Aug. 30, 2016 [Cited in Parent].
U.S. Appl. No. 15/100,174, filed May 27, 2016 [Cited in Parent].
Non-Final Office Action issued in Application related to U.S. Appl. No. 15/100,174, dated Jul. 27, 2017 [Cited in Parent].
Luo et al "Upconversion luminescence properties of Li doped ZnWO4:Yb,Er", J. Mater. Res. vol. 23, No. 8, Aug. 2008 (pp. 2078-2083). [Cited in Parent].
Office Action issued in U.S. Appl. No. 15/100,174, dated Feb. 1, 2018 [Cited in Parent].
Notice of Allowance issued in U.S. Appl. No. 15/100,174, dated May 18, 2018.
Restriction Requirement issued in U.S. Appl. No. 15/122,448, dated May 22, 2018.
Office Action issued Jul. 27, 2018 in U.S. Appl. No. 15/122,448.
U.S. Appl. No. 16/282,104, filed Feb. 21, 2019.
Office Action dated Mar. 20, 2019 from the counterpart TW Patent Application No. 107134618.
Office Action dated May 2, 2019 in counterpart Taiwan Application No. 105100433 [counterpart application of U.S. Appl. No. 15/122,448 and U.S. Appl. No. 16/282,104].
Notice of Allowance in U.S. Appl. No. 15/122,448, dated Jul. 1, 2019.

* cited by examiner

OXIDE SINTERED BODY AND METHOD FOR MANUFACTURING THE SAME, SPUTTERING TARGET, AND SEMICONDUCTOR DEVICE

CROSS-REFERENCE TO RELATED APPLICATIONS

This application is a Divisional of U.S. patent application Ser. No. 14/787,751, filed Oct. 28, 2015 (now U.S. Pat. No. 9,957,604), which is a 371 application of International Application No. PCT/JP2015/058061, filed Mar. 18, 2015, which claims the benefit of Japanese Patent Application Nos. 2014-061493, filed Mar. 25, 2014 and 2015-016695, filed Jan. 30, 2015.

TECHNICAL FIELD

The present invention relates to an oxide sintered body suitably used as a sputtering target for forming an oxide semiconductor film by a sputtering method, a method for manufacturing the oxide sintered body, a sputtering target including the oxide sintered body, and a semiconductor device including the oxide semiconductor film formed by the sputtering method with the sputtering target.

BACKGROUND ART

In a liquid crystal display device, a thin-film EL (electroluminescence) display device, an organic EL display device or the like, an amorphous silicon film has been conventionally mainly used as a semiconductor film that functions as a channel layer of a TFT (thin-film transistor) which is a semiconductor device.

In recent years, however, attention has been focused on an oxide semiconductor film mainly composed of an In—Ga—Zn-based composite oxide (hereinafter also referred to as "IGZO") as the aforementioned semiconductor film, because of the advantage of higher carrier mobility as compared with the amorphous silicon film.

For example, Japanese Patent Laying-Open No. 2008-199005 (PTD 1) discloses that this oxide semiconductor film mainly composed of IGZO is formed by a sputtering method by using an oxide sintered body as a target.

In addition, Japanese Patent Laying-Open No. 2008-192721 (PTD 2) discloses that a channel layer is formed by a sputtering method by using a target including titanium or tungsten and indium, and thus, a TFT having excellent operating characteristics is obtained.

In addition, as a material suitably used when forming an oxide transparent electroconductive film by a vacuum vapor deposition method such as an electron beam vapor deposition method, an ion plating method and a high-density plasma-assisted vapor deposition method, Japanese Patent Laying-Open No. 2006-347807 (PTD 3) discloses an oxide sintered body including indium oxide having tungsten solid-dissolved therein, including tungsten with a ratio of atomic number of tungsten to indium being equal to or higher than 0.001 and equal to or lower than 0.034, and having a density (apparent density) of equal to or higher than 4.0 g/cm$^3$ and equal to or lower than 6.5 g/cm$^3$.

CITATION LIST

Patent Document

PTD 1: Japanese Patent Laying-Open No. 2008-199005
PTD 2: Japanese Patent Laying-Open No. 2008-192721
PTD 3: Japanese Patent Laying-Open No. 2006-347807

SUMMARY OF INVENTION

Technical Problem

In the TFT (thin-film transistor) which is the semiconductor device including, as the channel layer, the oxide semiconductor film mainly composed of IGZO as disclosed in Japanese Patent Laying-Open No. 2008-199005 (PTD 1), gallium oxide made of metal gallium which is high in market price is used as a raw material, and thus, the TFT had a problem of high manufacturing cost.

The TFT including, as the channel layer, the oxide semiconductor film fabricated by using the target disclosed in Japanese Patent Laying-Open No. 2008-192721 (PTD 2) had a problem that an OFF current is high, i.e., approximately $1 \times 10^{-11}$ A, and thus, a ratio of an ON current to the OFF current cannot be sufficiently increased unless a driving voltage is raised to approximately 40 V.

The oxide sintered body disclosed in Japanese Patent Laying-Open No. 2006-347807 (PTD 3) had a problem that the density (apparent density) is low, i.e., equal to or lower than 6.5 g/cm$^3$, and thus, the oxide sintered body cannot be used as a sputtering target for the sputtering method which is an optimum method for forming the oxide semiconductor film.

Thus, an object of the present invention is to solve the aforementioned problems and provide an oxide sintered body that can be suitably used as a sputtering target for forming an oxide semiconductor film of a semiconductor device having high characteristics by a sputtering method, a method for manufacturing the oxide sintered body, a sputtering target including the oxide sintered body, and a semiconductor device including the oxide semiconductor film formed by the sputtering method by using the sputtering target.

Solution to Problem

An oxide sintered body according to an aspect of the present invention is an oxide sintered body including indium, tungsten and zinc, wherein the oxide sintered body includes a bixbite type crystal phase as a main component and has an apparent density of higher than 6.5 g/cm$^3$ and equal to or lower than 7.1 g/cm$^3$, a content rate of tungsten to a total of indium, tungsten and zinc in the oxide sintered body is higher than 1.2 atomic % and lower than 30 atomic %, and a content rate of zinc to the total of indium, tungsten and zinc in the oxide sintered body is higher than 1.2 atomic % and lower than 30 atomic %.

A sputtering target according to another aspect of the present invention includes the oxide sintered body according to the aforementioned aspect.

A semiconductor device according to still another aspect of the present invention includes an oxide semiconductor film formed by a sputtering method with the sputtering target according to the aforementioned aspect.

A method for manufacturing an oxide sintered body according to a further aspect of the present invention is a method for manufacturing the oxide sintered body according to the aforementioned aspect, the method including the steps of: preparing a primary mixture of a zinc oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body, wherein the step of forming a calcined powder includes forming a complex oxide powder including zinc and tungsten as the calcined powder by heat-treating the primary mixture at a temperature equal to or higher than 550° C. and lower than 1200° C. under an oxygen-containing atmosphere.

Advantageous Effects of Invention

According to the foregoing, there can be provided an oxide sintered body that can be suitably used as a sputtering target for forming an oxide semiconductor film of a semiconductor device having high characteristics by a sputtering method, a method for manufacturing the oxide sintered body, a sputtering target including the oxide sintered body, and a semiconductor device including the oxide semiconductor film formed by the sputtering method with the sputtering target.

BRIEF DESCRIPTION OF DRAWINGS

FIGS. 1(A) and 1(B) (collectively referred to as FIG. 1) are schematic views showing one example of a semiconductor device according to one aspect of the present invention, in which FIG. 1(A) shows a schematic plan view and FIG. 1(B) shows a schematic cross-sectional view taken along line IB-IB shown in FIG. 1(A).

DESCRIPTION OF EMBODIMENTS

Figure 1A:
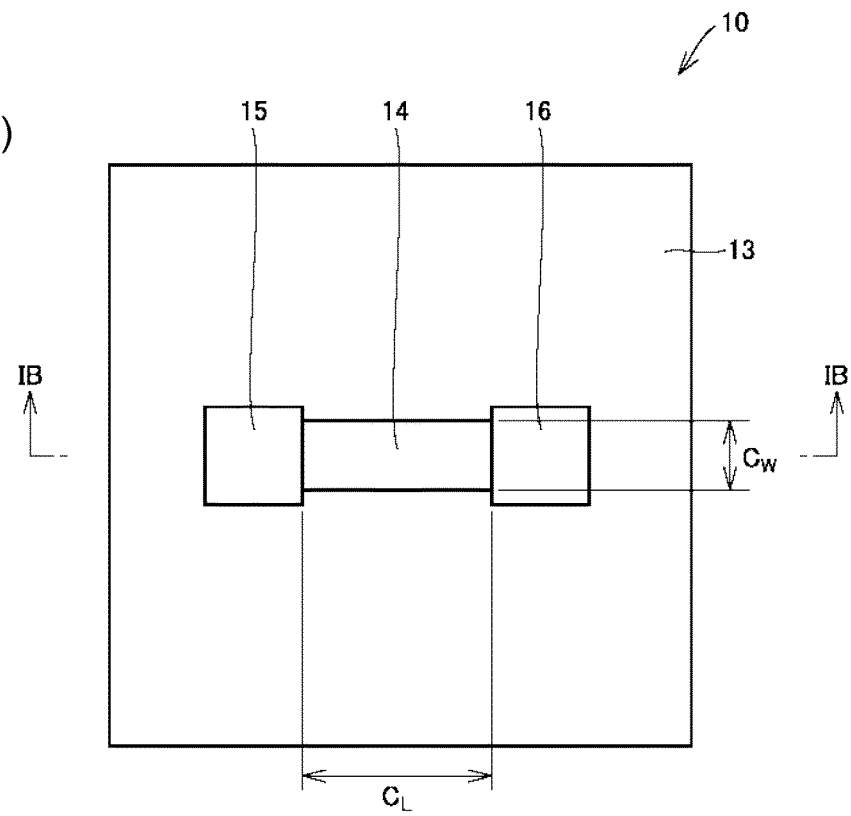

Description of Embodiments of the Present Invention

[1] An oxide sintered body which is an embodiment of the present invention is an oxide sintered body including indium, tungsten and zinc, wherein the oxide sintered body includes a bixbite type crystal phase as a main component and has an apparent density of higher than 6.5 g/cm$^3$ and equal to or lower than 7.1 g/cm$^3$. Since the oxide sintered body of the present embodiment includes a bixbite type crystal phase as a main component and has an apparent density of higher than 6.5 g/cm$^3$ and equal to or lower than 7.1 g/cm$^3$, the oxide sintered body of the present embodiment is suitably used as a sputtering target for forming an oxide semiconductor film of a semiconductor device having high characteristics by a sputtering method.

In the oxide sintered body of the present embodiment, a content rate of tungsten to a total of indium, tungsten and zinc in the oxide sintered body is higher than 1.2 atomic % and lower than 30 atomic %, and a content rate of zinc to the total of indium, tungsten and zinc in the oxide sintered body is higher than 1.2 atomic % and lower than 30 atomic %. As a result, in the semiconductor device including, as a channel layer, the oxide semiconductor film formed by using the sputtering target including the aforementioned oxide sintered body, a ratio of the ON current to the OFF current can be increased at low driving voltage.

[2] In the oxide sintered body of the present embodiment, the bixbite type crystal phase may include indium oxide as a main component, and include tungsten and zinc solid-dissolved in at least a part of the bixbite type crystal phase. As a result, in the semiconductor device including, as a channel layer, the oxide semiconductor film formed by using the sputtering target including the aforementioned oxide sintered body, a ratio of the ON current to the OFF current can be increased at low driving voltage.

[3] The oxide sintered body of the present embodiment may further include at least one type of element selected from the group consisting of aluminum, titanium, chromium, gallium, hafnium, zirconium, silicon, molybdenum, vanadium, niobium, tantalum, and bismuth. In this case, a content rate of the element to a total of indium, tungsten, zinc, and the element in the oxide sintered body may be equal to or higher than 0.1 atomic % and equal to or lower than 10 atomic %. As a result, in the semiconductor device including, as a channel layer, the oxide semiconductor film formed by using the sputtering target including the aforementioned oxide sintered body, a ratio of the ON current to the OFF current can be increased at low driving voltage.

[4] When the oxide sintered body of the present embodiment includes the aforementioned element, an atomic ratio (ratio of atomic number) of silicon to indium in the oxide sintered body may be lower than 0.007. As a result, an electric resistivity of the oxide semiconductor film formed by using the sputtering target including the aforementioned oxide sintered body can be increased.

[5] When the oxide sintered body of the present embodiment includes the aforementioned element, an atomic ratio (ratio of atomic number) of titanium to indium in the oxide sintered body may be lower than 0.004. As a result, an electric resistivity of the oxide semiconductor film formed by using the sputtering target including the aforementioned oxide sintered body can be increased.

[6] The oxide sintered body of the present embodiment may include tungsten having at least one of valences of six and four. As a result, in the semiconductor device including, as a channel layer, the oxide semiconductor film formed by using the sputtering target including the aforementioned oxide sintered body, a ratio of the ON current to the OFF current can be increased at low driving voltage.

[7] The oxide sintered body of the present embodiment may include tungsten whose bonding energy measured by X-ray photoelectron spectroscopy is equal to or higher than 245 eV and equal to or lower than 250 eV. As a result, in the semiconductor device including, as a channel layer, the oxide semiconductor film formed by using the sputtering target including the aforementioned oxide sintered body, a ratio of the ON current to the OFF current can be increased at low driving voltage.

[8] A sputtering target which is another embodiment of the present invention includes the oxide sintered body of the aforementioned embodiment. Since the sputtering target of the present embodiment includes the oxide sintered body of the aforementioned embodiment, the sputtering target of the present embodiment is suitably used to form an oxide semiconductor film of a semiconductor device having high characteristics by a sputtering method.

[9] The semiconductor device which is still another embodiment of the present invention includes an oxide semiconductor film formed by a sputtering method with the sputtering target of the aforementioned embodiment. Since the semiconductor device of the present embodiment includes an oxide semiconductor film formed by a sputtering method with the sputtering target of the aforementioned embodiment, the semiconductor device of the present embodiment can exhibit high characteristics. Although the semiconductor device described herein is not particularly limited, a TFT (thin-film transistor) including, as a channel layer, the oxide semiconductor film formed by the sputtering method with the sputtering target of the aforementioned embodiment is a suitable example.

[10] In the semiconductor device of the present embodiment, a content rate of tungsten to a total of indium, tungsten and zinc in the oxide semiconductor film may be higher than 1.2 atomic % and lower than 30 atomic %, and a content rate of zinc to the total of indium, tungsten and zinc in the oxide semiconductor film may be higher than 1.2 atomic % and lower than 30 atomic %. As a result, in the semiconductor device including the oxide semiconductor film as a channel layer, a ratio of the ON current to the OFF current can be increased at low driving voltage.

[11] In the semiconductor device of the present embodiment, an atomic ratio of tungsten to zinc in the oxide semiconductor film may be higher than 0.5 and lower than 3.0. As a result, in the semiconductor device including the oxide semiconductor film as a channel layer, a ratio of the ON current to the OFF current can be increased at low driving voltage.

[12] In the semiconductor device of the present embodiment, an atomic ratio of silicon to indium in the oxide semiconductor film may be lower than 0.007. As a result, an electric resistivity of the oxide semiconductor film can be increased to be equal to or higher than $1 \times 10^2$ Ωcm.

[13] In the semiconductor device of the present embodiment, an atomic ratio of titanium to indium in the oxide semiconductor film may be lower than 0.004. As a result, an electric resistivity of the oxide semiconductor film can be increased to be equal to or higher than $1 \times 10^2$ Ωcm.

[14] In the semiconductor device of the present embodiment, the oxide semiconductor film may include tungsten having at least one of valences of six and four. As a result, in the semiconductor device including the oxide semiconductor film as a channel layer, a ratio of the ON current to the OFF current can be increased at low driving voltage.

[15] In the semiconductor device of the present embodiment, the oxide semiconductor film may include tungsten whose bonding energy measured by X-ray photoelectron spectroscopy is equal to or higher than 245 eV and equal to or lower than 250 eV. As a result, in the semiconductor device including the oxide semiconductor film as a channel layer, a ratio of the ON current to the OFF current can be increased at low driving voltage.

[16] A method for manufacturing an oxide sintered body which is a further embodiment of the present invention is a method for manufacturing the oxide sintered body of the aforementioned embodiment, the method including the steps of: preparing a primary mixture of a zinc oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body, wherein the step of forming a calcined powder includes forming a complex oxide powder including zinc and tungsten as the calcined powder by heat-treating the primary mixture at a temperature equal to or higher than 550° C. and lower than 1200° C. under an oxygen-containing atmosphere. According to the method for manufacturing the oxide sintered body of the present embodiment, the step of forming a calcined powder includes forming a complex oxide powder including zinc and tungsten by mixing the zinc oxide powder and the tungsten oxide powder, and heat-treating the mixture at a temperature equal to or higher than 550° C. and lower than 1200° C. under an oxygen-containing atmosphere, and thus, an apparent density of the oxide sintered body is increased and the oxide sintered body that can be suitably used as a sputtering target is obtained.

[17] In the method for manufacturing the oxide sintered body of the present embodiment, the tungsten oxide powder may include at least one type of crystal phase selected from the group consisting of a $WO_3$ crystal phase, a $WO_2$ crystal phase and a $W_{2.72}$ crystal phase. As a result, an apparent density of the oxide sintered body is increased and the oxide sintered body that can be suitably used as a sputtering target is obtained.

[18] In the method for manufacturing the oxide sintered body of the present embodiment, a median particle size d50 of the tungsten oxide powder may be equal to or larger than 0.1 μm and equal to or smaller than 4 μm. As a result, an apparent density of the oxide sintered body is increased and the oxide sintered body that can be suitably used as a sputtering target is obtained.

[19] In the method for manufacturing the oxide sintered body of the present embodiment, the complex oxide may include a $ZnWO_4$ type crystal phase. As a result, an apparent density of the oxide sintered body is increased and the oxide sintered body that can be suitably used as a sputtering target is obtained.

Details of Embodiments of the Present Invention

First Embodiment: Oxide Sintered Body

An oxide sintered body of the present embodiment is an oxide sintered body including indium, tungsten and zinc, wherein the oxide sintered body includes a bixbite type crystal phase as a main component and has an apparent density of higher than 6.5 g/cm$^3$ and equal to or lower than 7.1 g/cm$^3$. Since the oxide sintered body of the present embodiment includes a bixbite type crystal phase as a main component and has an apparent density of higher than 6.5 g/cm$^3$ and equal to or lower than 7.1 g/cm$^3$, the oxide sintered body of the present embodiment is suitably used as a sputtering target for forming an oxide semiconductor film of a semiconductor device having high characteristics by a sputtering method.

In the present specification, "bixbite type crystal phase" is a generic term for a bixbite crystal phase as well as a phase including the same crystal structure as that of the bixbite crystal phase, in which at least one element of silicon (Si) and a metal element other than indium (In) is included in at least a part of the bixbite crystal phase. The bixbite crystal phase is one of the crystal phases of indium oxide ($In_2O_3$) and refers to a crystal structure defined in 6-0416 of the JCPDS card, and is also called "rare-earth oxide C type phase (or C-rare earth structure phase)".

The bixbite type crystal phase can be identified by X-ray diffraction. Namely, by the X-ray diffraction, the presence of the bixbite type crystal phase can be identified and lattice spacing can be measured.

In addition, "includes a bixbite type crystal phase as a main component" refers to the case in which a ratio of the bixbite type crystal phase in the oxide sintered body (an occupancy rate of the bixbite type crystal phase described below) is equal to or higher than 90%. The oxide sintered body may sometimes include the other crystal phases such as an inclusion-unavoidable crystal phase. A method for distinguishing the bixbite type crystal phase from the crystal phases other than the bixbite type crystal phase is as follows.

First, the presence of the bixbite type crystal phase and the presence of the crystal phases other than the bixbite type crystal phase are identified by the X-ray diffraction. In some cases, only the bixbite type crystal phase is identified by the X-ray diffraction. When only the bixbite type crystal phase is identified, it is determined that the bixbite type crystal phase is a main component.

When the presence of the bixbite type crystal phase and the presence of the crystal phases other than the bixbite type crystal phase are identified by the X-ray diffraction, a sample is obtained from a part of the oxide sintered body and a surface of the sample is polished to make the surface smooth. Then, by using SEM-EDX (scanning secondary electron microscope with an energy-dispersive X-ray fluorescence spectrometer), the surface of the sample is observed by an SEM (scanning secondary electron microscope) and a composition ratio of the metal elements of the respective crystal particles is analyzed by an EDX (energy-dispersive X-ray fluorescence spectrometer). The crystal particles are grouped in accordance with a tendency of the composition ratio of the metal elements of these crystal particles. Specifically, the crystal particles can be divided into a group of the crystal particles having a high Zn content rate or having a high W content rate or having a high Zn content rate and a high W content rate, and a group of the crystal particles having a very low Zn content rate and a very low W content rate and having a high In content rate. The group of the crystal particles having a high Zn content rate or having a high W content rate or having a high Zn content rate and a high W content rate is concluded as the other crystal phases, and the group of the crystal particles having a very low Zn content rate and a very low W content rate and having a high In content rate is concluded as the $In_2O_3$ type phase which is the bixbite type crystal phase.

The occupancy rate of the bixbite type crystal phase in the oxide sintered body is defined as a ratio (percentage) of an area of the bixbite type crystal phase to the aforementioned measured surface of the oxide sintered body. Therefore, the oxide sintered body of the present embodiment is mainly composed of the bixbite type crystal phase and the occupancy rate of the bixbite type crystal phase defined above is equal to or higher than 90%.

In addition, the oxide sintered body of the present embodiment has an apparent density of higher than 6.5 $g/cm^3$ and equal to or lower than 7.1 $g/cm^3$. In contrast, the oxide sintered body disclosed in Japanese Patent Laying-Open No. 2006-347807 has an apparent density of equal to or higher than 4.0 $g/cm^3$ and equal to or lower than 6.5 $g/cm^3$, and thus, the apparent density of the sintered body is lower than that of the oxide sintered body of the present embodiment.

Considering that a theoretical density of a bixbite crystal phase made of indium oxide is 7.28 $g/cm^3$ and that each of tungsten and zinc are solid-dissolved in a substitutional-type manner in at least a part of the bixbite crystal phase at a ratio ranging from 1.2 atomic % to 30 atomic %, a theoretical density of the bixbite type crystal phase which is the main component of the oxide sintered body of the present embodiment is considered to be 7.19 $g/cm^3$ at minimum and 7.24 $g/cm^3$ at maximum. Then, a percentage of the apparent density of the sintered body to the theoretical density, i.e., a relative density of the sintered body is low, i.e., equal to or higher than 55.2% and equal to or lower than 90.4% in the case of the oxide sintered body disclosed in Japanese Patent Laying-Open No. 2006-347807, whereas the relative density is extremely high, i.e., higher than 90.4% and equal to or lower than 99.0% in the case of the oxide sintered body of the present embodiment.

In the case of using the sintered body as the sputtering target, a higher apparent density of the sintered body is considered to be desirable. A low apparent density of the sintered body means that there are many vacancies in the sintered body. During use of the sputtering target, a surface thereof is etched by an argon ion. Therefore, if there are vacancies in the sintered body, these vacancies are exposed and the internal gas is released during film formation, and thus, the gas released from the target enters a deposited oxide semiconductor thin film and the film characteristics are degraded. Furthermore, if the apparent density of the sintered body is low, it is known that an insulator of indium called "nodule" is generated on the target at the time of film formation and thus good sputter discharge is inhibited. From this perspective as well, it is desired to increase the apparent density of the sintered body.

Namely, since the apparent density of the oxide sintered body of the present embodiment is high, i.e., higher than 6.5 $g/cm^3$ and equal to or lower than 7.1 $g/cm^3$, the oxide sintered body of the present embodiment is suitably used as the sputtering target for forming the oxide semiconductor film of the semiconductor device having high characteristics by the sputtering method.

In the oxide sintered body of the present embodiment, a content rate of tungsten to a total of indium, tungsten and zinc in the oxide sintered body (hereinafter also referred to as "W content rate" in the oxide sintered body) is higher than 1.2 atomic % and lower than 30 atomic %, and a content rate of zinc to the total of indium, tungsten and zinc in the oxide sintered body (hereinafter also referred to as "Zn content rate" in the oxide sintered body) is higher than 1.2 atomic % and lower than 30 atomic %. According to this oxide sintered body, in the semiconductor device (e.g., a TFT) including, as a channel layer, the oxide semiconductor film formed by using the oxide sintered body, a ratio of the ON current to the OFF current can be increased at low driving voltage.

In addition, from the aforementioned perspective, the W content rate in the oxide sintered body is preferably higher than 2.0 atomic % and lower than 15 atomic %, and more preferably higher than 4.0 atomic % and lower than 12 atomic %. In addition, from the aforementioned perspective, the Zn content rate in the oxide sintered body is preferably higher than 2.0 atomic % and lower than 15 atomic %, and more preferably higher than 4.0 atomic % and lower than 12 atomic %.

If the W content rate in the oxide sintered body is equal to or lower than 1.2 atomic %, the OFF current increases and the ratio of the ON current to the OFF current decreases in the semiconductor device (e.g., a TFT) including, as a channel layer, the oxide semiconductor film formed by using the oxide sintered body. If the W content rate in the oxide sintered body is equal to or higher than 30 atomic %, the ON current decreases or the ratio of the ON current to the OFF current decreases at low driving voltage in the semiconductor device including, as a channel layer, the oxide semiconductor film formed by using the oxide sintered body.

If the Zn content rate in the oxide sintered body is equal to or lower than 1.2 atomic %, the OFF current increases and the ratio of the ON current to the OFF current decreases in the semiconductor device including, as a channel layer, the oxide semiconductor film formed by using the oxide sintered body. If the Zn content rate in the oxide sintered body is equal to or higher than 30 atomic %, the ON current decreases or the ratio of the ON current to the OFF current decreases at low driving voltage in the semiconductor device including, as a channel layer, the oxide semiconductor film formed by using the oxide sintered body.

In the oxide sintered body of the present embodiment, it is preferable that the bixbite type crystal phase includes indium oxide as a main component, and includes tungsten and zinc solid-dissolved in at least a part of the bixbite type crystal phase. According to this oxide sintered body, in the semiconductor device (e.g., a TFT) including, as a channel layer, the oxide semiconductor film formed by using the oxide sintered body, the ratio of the ON current to the OFF current can be increased at low driving voltage.

In the oxide sintered body of the present embodiment, "the bixbite type crystal phase includes indium oxide as a main component, and tungsten and zinc are solid-dissolved in at least a part thereof" refers to a configuration in which tungsten and zinc are solid-dissolved in a substitutional-type manner in at least a part of a crystal lattice of indium oxide having the bixbite crystal phase, or a configuration in which tungsten and zinc are solid-dissolved in an interstitial-type manner in between the crystal lattices, or a configuration in which tungsten and zinc are solid-dissolved in both a substitutional-type manner and an interstitial-type manner.

In the oxide sintered body of the present embodiment, when tungsten and zinc are solid-dissolved in at least a part of the bixbite type crystal phase, the lattice spacing is wider or narrower than the lattice spacing defined in 6-0416 of the JCPDS card. In the X-ray diffraction, a peak position is shifted toward the high-angle side or shifted toward the low-angle side. When this peak shift is seen and the presence of a region where indium and tungsten and zinc are mixedly present is seen by surface analysis with SEM-EDX (scanning secondary electron microscope with an energy-dispersive X-ray fluorescence spectrometer) or TEM-EDX (transmission secondary electron microscope with an energy-dispersive X-ray fluorescence spectrometer), it can be estimated that tungsten and zinc are solid-dissolved in the bixbite type crystal phase.

Alternatively, when the presence of zinc and tungsten is seen together with indium as a result of identification of the present elements with the ICP (inductively-coupled plasma) mass spectrometry, the SEM-EDX or the other element identification methods, while an oxide of zinc, an oxide of tungsten, and a complex oxide of zinc and tungsten are not seen in the X-ray diffraction, it can also be determined that tungsten or zinc is solid-dissolved in the bixbite type crystal phase.

The oxide sintered body of the present embodiment can further include at least one type of element M selected from the group consisting of aluminum (Al), titanium (Ti), chromium (Cr), gallium (Ga), hafnium (Hf), zirconium (Zr), silicon (Si), molybdenum (Mo), vanadium (V), niobium (Nb), tantalum (Ta), and bismuth (Bi). In this case, a content rate of element M to a total of indium (In), tungsten (W), zinc (Zn), and the element (M) in the oxide sintered body (hereinafter also referred to as "M content rate" in the oxide sintered body) is preferably equal to or higher than 0.1 atomic % and equal to or lower than 10 atomic %. According to this oxide sintered body, in the semiconductor device (e.g., a TFT) including, as a channel layer, the oxide semiconductor film formed by using the oxide sintered body, the ratio of the ON current to the OFF current can be increased at low driving voltage. In addition, from this perspective, the M content rate in the oxide sintered body is more preferably equal to or higher than 0.1 atomic % and equal to or lower than 5 atomic %, and further preferably equal to or higher than 0.1 atomic % and equal to or lower than 1 atomic %.

When a content rate of at least one type of added element of Al, Ti, Cr, Ga, Hf, Si, V, and Nb is equal to or higher than 0.1 atomic %, the OFF current of the semiconductor device including the oxide semiconductor obtained by using the oxide sintered body decreases advantageously. However, if the content rate of this added element is higher than 10 atomic %, the ON current of the semiconductor device tends to decrease.

In addition, when a content rate of at least one type of added element of Zr, Mo, Ta, and Bi is equal to or higher than 0.1 atomic %, the ON current of the semiconductor device including the oxide semiconductor obtained by using the oxide sintered body increases advantageously. However, if the content rate of this added element is higher than 10 atomic %, the OFF current of the semiconductor device tends to increase.

Since the oxide semiconductor film formed by using the oxide sintered body according to the present embodiment is used as a semiconductor layer of the semiconductor device, it is desirable that an electric resistivity is higher than that desired as a transparent electroconductive film. Specifically, it is preferable that an electric resistivity of the oxide semiconductor film formed by using the oxide sintered body according to the present embodiment is equal to or higher than $1 \times 10^2$ Ωcm. For this purpose, it is preferable that a content rate of Si that may be included in the oxide sintered body is lower than 0.007 in a ratio of Si/In atomic number. In addition, it is preferable that a content rate of Ti that may be included in the oxide sintered body is lower than 0.004 in a ratio of Ti/In atomic number.

The electric resistivity of the oxide semiconductor film is measured by the four-terminal method. Mo electrodes are formed as electrode members by the sputtering method. Then, a voltage between the inner electrodes is measured while a voltage of −40 V to +40 V is swept to the outer electrodes and a current is passed. The electric resistivity is thus calculated.

It is preferable that the oxide sintered body of the present embodiment includes tungsten having at least one of valences of six and four. According to this oxide sintered body, in the semiconductor device (e.g., a TFT) including, as a channel layer, the oxide semiconductor film formed by using the oxide sintered body, the ratio of the ON current to the OFF current can be increased at low driving voltage.

It is also preferable that the oxide sintered body of the present embodiment includes tungsten whose bonding energy measured by X-ray photoelectron spectroscopy is equal to or higher than 245 eV and equal to or lower than 250 eV. According to this oxide sintered body, in the semiconductor device (e.g., a TFT) including, as a channel layer, the oxide semiconductor film formed by using the oxide sintered body, the ratio of the ON current to the OFF current can be increased at low driving voltage.

It is known that tungsten has various valences as an ion. When tungsten has at least one of valences of four and six among these valences, the ON current can be increased and the ratio of the ON current to the OFF current can be increased at low driving voltage in the semiconductor device (e.g., a TFT) including, as a channel layer, the oxide semiconductor film formed by using the oxide sintered body. Tungsten may have only a valence of four or only a valence of six, or may have both a valence of four and a valence of six, or may further include any other valence number that does not form a main component. It is preferable that tungsten having at least one of valences of four and six is equal to or larger than 70 atomic % of a total amount of tungsten.

In the X-ray photoelectron spectroscopy (XPS), the valence can be obtained from the bonding energy of tungsten and a ratio of the valence number can be obtained by peak separation. The bonding energy of tungsten included in the oxide sintered body of the present embodiment is measured by the X-ray photoelectron spectroscopy. Then, when the peak position is equal to or higher than 245 eV and equal to or lower than 250 eV, the ON current can be increased and the ratio of the ON current to the OFF current can be increased at low driving voltage in the semiconductor device (e.g., a TFT) including the oxide semiconductor film as a channel layer. From this perspective, the aforementioned bonding energy is more preferably equal to or higher than 246 eV and equal to or lower than 249 eV, and further preferably equal to or higher than 246 eV and equal to or lower than 248 eV.

It is known that a peak of the bonding energy of tungsten 4d5/2 of $WO_3$ having a valence of six appears in a range of 247 eV to 249 eV, and a peak of the bonding energy of tungsten metal and tungsten 4d5/2 of $WO_2$ having a valence of four appears in a range of 243 eV to 244 eV. Based on this, it is preferable that the oxide sintered body of the present embodiment mainly has a valence of six, from the perspective of increasing the ON current and increasing the ratio of the ON current to the OFF current at low driving voltage in the semiconductor device (e.g., a TFT) including, as a channel layer, the oxide semiconductor film formed by using the oxide sintered body.

Second Embodiment: Method for Manufacturing Oxide Sintered Body

A method for manufacturing an oxide sintered body of the present embodiment is a method for manufacturing the oxide sintered body of the first embodiment, the method including the steps of: preparing a primary mixture of a zinc oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body. The step of forming a calcined powder includes forming a complex oxide powder including zinc and tungsten as the calcined powder by heat-treating the primary mixture at a temperature equal to or higher than 550° C. and lower than 1200° C. under an oxygen-containing atmosphere.

According to the method for manufacturing the oxide sintered body of the present embodiment, the step of forming a calcined powder includes forming a complex oxide powder including zinc and tungsten as the calcined powder by heat-treating the primary mixture of the zinc oxide powder and the tungsten oxide powder at the temperature equal to or higher than 550° C. and lower than 1200° C. under the oxygen-containing atmosphere, and thus, the apparent density of the oxide sintered body is increased and the oxide sintered body that can be suitably used as the sputtering target is obtained.

In the method for manufacturing the oxide sintered body of the present embodiment, the zinc oxide powder and the tungsten oxide powder in the raw material powders are mixed to prepare the primary mixture, and the complex oxide powder including zinc and tungsten is formed as the calcined powder by heat-treating this primary mixture at the temperature equal to or higher than 550° C. and lower than 1200° C. under the oxygen-containing atmosphere, and thus, the apparent density of the oxide sintered body can be increased. The complex oxide may be short of oxygen or any metal may be substituted. If the heat treatment temperature is lower than 550° C., the complex oxide powder including zinc and tungsten is not obtained. If the heat treatment temperature is equal to or higher than 1200° C., the complex oxide powder including zinc and tungsten decomposes and scatters, or a particle size of the powder becomes too large.

In addition, since the complex oxide powder including zinc and tungsten is formed as the calcined powder by heat-treating the primary mixture of the zinc oxide powder and the tungsten oxide powder at the temperature equal to or higher than 550° C. and lower than 1200° C. under the oxygen-containing atmosphere, tungsten in the oxide sintered body can have at least one of valences of four and six. As a result, in the semiconductor device including, as a channel layer, the oxide semiconductor film formed by using the sputtering target including the obtained oxide sintered body, the ratio of the ON current to the OFF current can be increased at low driving voltage.

Here, from the perspectives of increasing the apparent density of the oxide sintered body and of increasing a ratio of tungsten having at least one of valences of six and four in the oxide sintered body, it is preferable that the complex oxide including zinc and tungsten includes a $ZnWO_4$ type crystal phase. The $ZnWO_4$ type crystal phase has a crystal structure expressed by a space group of P12/c1(13) and is a zinc tungstate compound crystal phase having a crystal structure defined in 01-088-0251 of the JCPDS card. As long as the complex oxide exhibits these crystal systems, a lattice constant may vary due to shortage of oxygen or solid-dissolution of metal.

In addition, from the perspectives of increasing the apparent density of the oxide sintered body and of increasing the ratio of tungsten having at least one of valences of six and four in the oxide sintered body, it is preferable that the tungsten oxide powder includes at least one type of crystal phase selected from the group consisting of a $WO_3$ crystal phase, a $WO_2$ crystal phase and a $WO_{2.72}$ crystal phase. From these perspectives, it is more preferable that the tungsten oxide powder is at least one powder selected from the group consisting of a $WO_3$ powder, a $WO_2$ powder and a $W_{2.72}$ powder.

In addition, from the perspective of increasing the apparent density of the oxide sintered body, median particle size d50 of the tungsten oxide powder is preferably equal to or larger than 0.1 μm and equal to or smaller than 4 μm, more preferably equal to or larger than 0.2 μm and equal to or smaller than 2 μm, and further preferably equal to or larger than 0.3 μm and equal to or smaller than 1.5 μm. Median particle size d50 herein is a value obtained by BET specific surface area measurement. If median particle size d50 is smaller than 0.1 μm, handling of the powder is difficult and it is difficult to uniformly mix the zinc oxide powder and the tungsten oxide powder. If median particle size d50 is larger than 4 μm, the particle size of the complex oxide powder including zinc and tungsten, which is obtained by mixing with the zinc oxide powder and thereafter heat-treating the mixture at the temperature equal to or higher than 550° C. and lower than 1200° C. under the oxygen-containing atmosphere, becomes large and it is difficult to increase the apparent density of the oxide sintered body.

In addition, from the perspective of increasing the apparent density of the oxide sintered body, it is preferable that the aforementioned complex oxide includes the $ZnWO_4$ type crystal phase.

The method for manufacturing the oxide sintered body of the present embodiment is not particularly limited. However, from the perspective of efficiently forming the oxide sintered body of the first embodiment, the method for manufacturing the oxide sintered body of the present embodiment includes the following steps, for example.

1. Step of Preparing Raw Material Powders

As the raw material powders for the oxide sintered body, oxide powders of the metal elements or Si that constitute the oxide sintered body, such as an indium oxide powder (e.g., an $In_2O_3$ powder), a tungsten oxide powder (e.g., a $WO_3$ powder, a $WO_{2.72}$ powder, a $WO_2$ powder) and a zinc oxide powder (e.g., a ZnO powder), are prepared. As to the tungsten oxide powder, from the perspective of allowing tungsten in the oxide sintered body to have at least one of valences of six and four, it is preferable that not only the $WO_3$ powder but also the powder such as the $WO_{2.72}$ powder and the $WO_2$ powder having a chemical composition that is short of oxygen as compared with the $WO_3$ powder is used as a raw material. From this perspective, it is more preferable to use at least one of the $WO_{2.72}$ powder and the $WO_2$ powder as at least a part of the tungsten oxide powder. From the perspective of preventing unintended entry of the metal elements and Si into the oxide sintered body and obtaining the stable properties, it is preferable that a purity of the raw material powders is high, i.e., equal to or higher than 99.9 mass %.

In addition, from the perspective of increasing the apparent density of the oxide sintered body, it is preferable that median particle size d50 of the tungsten oxide powder is equal to or larger than 0.1 μm and equal to or smaller than 4 μm.

2. Step of Preparing Primary Mixture of Raw Material Powders

Among the aforementioned raw material powders, the tungsten oxide powder (the $WO_3$ powder, the $WO_{2.72}$ powder and/or the $WO_2$ powder) and the zinc oxide powder (the ZnO powder) are pulverized and mixed. At this time, when it is desired to obtain the $ZnWO_4$ type phase as the crystal phase of the oxide sintered body, the tungsten oxide powder and the zinc oxide powder as the raw material powders are mixed at a molar ratio of 1:1. When it is desired to obtain a $Zn_2W_3O_8$ type phase as the crystal phase of the oxide sintered body, the tungsten oxide powder and the zinc oxide powder as the raw material powders are mixed at a molar ratio of 3:2. From the perspective of increasing the apparent density of the oxide sintered body, it is preferable to use the $ZnWO_4$ type phase. A method for pulverizing and mixing the raw material powders is not particularly limited, and either a dry-type method or a wet-type method may be used. Specifically, the raw material powders are pulverized and mixed by using a ball mill, a planetary ball mill, a bead mill or the like. In this way, the primary mixture of the raw material powders is obtained. A drying method such as natural drying or a spray dryer may be preferably used to dry the mixture obtained by using the wet-type pulverizing and mixing method.

3. Step of Forming Calcined Powder by Heat-Treating Primary Mixture

Next, the obtained primary mixture is heat-treated (calcined). A temperature for calcining the primary mixture is preferably lower than 1200° C. to prevent a particle size of the calcined product from becoming too large and the apparent density of the sintered body from decreasing. In order to obtain the $ZnWO_4$ type crystal phase or the $Zn_2W_3O_8$ type crystal phase as the calcined product, the temperature is preferably equal to or higher than 550° C. The temperature is more preferably equal to or higher than 550° C. and lower than 1000° C., and further preferably equal to or higher than 550° C. and equal to or lower than 800° C. In this way, the calcined powder including the $ZnWO_4$ type crystal phase or the $Zn_2W_3O_8$ type crystal phase is obtained. Any atmosphere may be used as a calcination atmosphere, as long as the calcination atmosphere is an oxygen-containing atmosphere. However, an atmospheric pressure or an air atmosphere pressurized as compared with the atmospheric air or an oxygen-nitrogen mixing atmosphere including oxygen at 25 volume % or more is preferable. The atmospheric pressure and the air atmosphere are more preferable because of high productivity.

4. Step of Preparing Secondary Mixture of Raw Material Powders including Calcined Powder Next, the obtained calcined powder and the $In_2O_3$ powder among the aforementioned raw material powders are pulverized and mixed by the pulverizing and mixing method similar to the one described above. In this way, the secondary mixture of the raw material powders is obtained.

5. Step of Forming Molded Body by Molding Secondary Mixture

Next, the obtained secondary mixture is molded. A method for molding the secondary mixture is not particularly limited. However, from the perspective of increasing the apparent density of the sintered body, a uniaxial press method, a CIP (cold isostatic press) method, a casting method or the like is preferable. In this way, the molded body is obtained.

6. Step of Forming Oxide Sintered Body by Sintering Molded Body

Next, the obtained molded body is sintered. It is preferable not to use a hot press sintering method. A temperature for sintering the molded body is not particularly limited. However, from the perspective of making the apparent density of the formed oxide sintered body higher than 6.5 g/cm³, the temperature is preferably equal to or higher than 900° C. and equal to or lower than 1200° C. In addition, a sintering atmosphere is not particularly limited. However, from the perspective of preventing the particle size of the crystals that constitute the oxide sintered body from becoming large and preventing occurrence of cracks, the atmospheric pressure and the air atmosphere are preferable. In this way, the oxide sintered body of the present embodiment is obtained.

Third Embodiment: Sputtering Target

The sputtering target of the present embodiment includes the oxide sintered body of the first embodiment. Since the sputtering target of the present embodiment includes the oxide sintered body of the first embodiment, the sputtering target of the present embodiment can be suitably used to form the oxide semiconductor film of the semiconductor device having high characteristics by the sputtering method.

The sputtering target of the present embodiment preferably includes the oxide sintered body of the first embodiment, and is more preferably formed of the oxide sintered body of the first embodiment, in order to allow the sputtering target of the present embodiment to be suitably used to form the oxide semiconductor film of the semiconductor device having high characteristics by the sputtering method.

Fourth Embodiment: Semiconductor Device

Figure 1B:
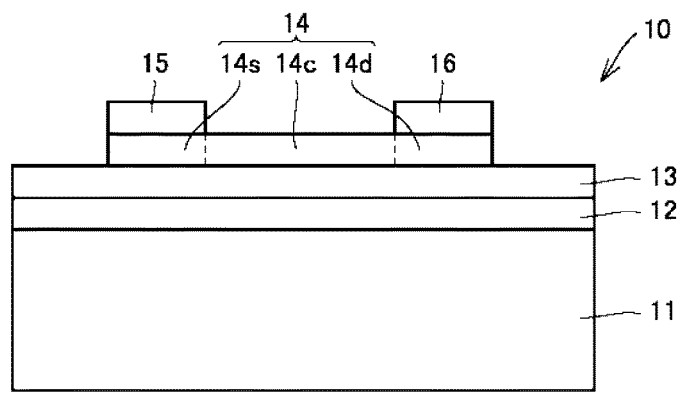

Referring to FIG. 1, a semiconductor device 10 of the present embodiment includes an oxide semiconductor film 14 formed by the sputtering method by using the oxide sintered body of the first embodiment as the sputtering target. Since the semiconductor device of the present embodiment includes the oxide semiconductor film formed by the sputtering method by using the oxide sintered body of the first embodiment as the sputtering target, the semiconductor device of the present embodiment has high characteristics.

Although semiconductor device 10 of the present embodiment is not particularly limited, semiconductor device 10 of the present embodiment is, for example, a TFT (thin-film transistor) which is semiconductor device 10 including, as a channel layer, oxide semiconductor film 14 formed by the sputtering method by using the oxide sintered body of the first embodiment as the sputtering target. Since the TFT which is one example of semiconductor device 10 of the present embodiment includes, as a channel layer, oxide semiconductor film 14 formed by the sputtering method by using the oxide sintered body of the aforementioned embodiment as the target, the OFF current is decreased and the ratio of the ON current to the OFF current is increased at low driving voltage.

More specifically, as shown in FIG. 1, the TFT which is semiconductor device 10 of the present embodiment includes a substrate 11, a gate electrode 12 arranged on substrate 11, a gate insulating film 13 arranged on gate electrode 12 as an insulating layer, oxide semiconductor film 14 arranged on gate insulating film 13 as a channel layer, and a source electrode 15 and a drain electrode 16 arranged on oxide semiconductor film 14 so as not to be in contact with each other.

From the perspective of increasing the ratio of the ON current to the OFF current at low driving voltage in the TFT which is semiconductor device 10 of the present embodiment, it is preferable that a content rate of tungsten to a total of indium, tungsten and zinc in oxide semiconductor film 14 (hereinafter also referred to as "W content rate" in oxide semiconductor film 14) is higher than 1.2 atomic % and lower than 30 atomic %, and a content rate of zinc to the total of indium, tungsten and zinc in oxide semiconductor film 14 (hereinafter also referred to as "Zn content rate" in oxide semiconductor film 14) is higher than 1.2 atomic % and lower than 30 atomic %. Here, the chemical composition, i.e., the content rate of each element, of oxide semiconductor film 14 is measured by RBS (Rutherford backscattering analysis).

In addition, from the aforementioned perspective, the W content rate in oxide semiconductor film 14 is more preferably higher than 2.0 atomic % and lower than 15 atomic %, and further preferably higher than 4.0 atomic % and lower than 12 atomic %. In addition, from the aforementioned perspective, the Zn content rate in oxide semiconductor film 14 is more preferably higher than 2.0 atomic % and lower than 15 atomic %, and further preferably higher than 4.0 atomic % and lower than 12 atomic %.

If the W content rate in oxide semiconductor film 14 is equal to or lower than 1.2 atomic %, the OFF current tends to increase and the ratio of the ON current to the OFF current tends to decrease in the TFT which is semiconductor device 10 including oxide semiconductor film 14 as the channel layer. If the W content rate in oxide semiconductor film 14 is equal to or higher than 30 atomic %, the ON current tends to decrease or the ratio of the ON current to the OFF current tends to decrease at low driving voltage in the TFT which is semiconductor device 10 including oxide semiconductor film 14 as the channel layer.

If the Zn content rate in oxide semiconductor film 14 is equal to or lower than 1.2 atomic %, the OFF current tends to increase and the ratio of the ON current to the OFF current tends to decrease in the TFT which is semiconductor device 10 including oxide semiconductor film 14 as the channel layer. If the Zn content rate in oxide semiconductor film 14 is equal to or higher than 30 atomic %, the ON current tends to decrease or the ratio of the ON current to the OFF current tends to decrease at low driving voltage in the TFT which is semiconductor device 10 including oxide semiconductor film 14 as the channel layer.

From the perspective of increasing the ratio of the ON current to the OFF current at low driving voltage in the TFT which is semiconductor device 10 of the present embodiment, an atomic ratio of tungsten to zinc included in oxide semiconductor film 14 (hereinafter also referred to as "W/Zn atomic ratio") is preferably higher than 0.5 and lower than 3.0, more preferably higher than 0.8 and lower than 2.5, and further preferably higher than 1.0 and lower than 2.2. Here, the chemical composition, i.e., the W/Zn atomic ratio, of oxide semiconductor film 14 is measured by the RBS (Rutherford backscattering analysis).

If the W/Zn atomic ratio is equal to or higher than 3.0, the OFF current increases and the ratio of the ON current to the OFF current decreases in the TFT which is semiconductor device 10 including this oxide semiconductor film as the channel layer. If the W/Zn atomic ratio is equal to or lower than 0.5, the ON current decreases or the ratio of the ON current to the OFF current decreases at low driving voltage in the TFT which is semiconductor device 10 including oxide semiconductor film 14 as the channel layer.

From the perspective of increasing the ON current and increasing the ratio of the ON current to the OFF current at low driving voltage in the TFT which is semiconductor device 10 of the present embodiment, it is preferable that oxide semiconductor film 14 includes tungsten having at least one of valences of six and four.

From the perspective of increasing the ratio of the ON current to the OFF current at low driving voltage in the TFT which is semiconductor device 10 of the present embodiment, it is preferable that oxide semiconductor film 14 includes tungsten whose bonding energy measured by the X-ray photoelectron spectroscopy is equal to or higher than 245 eV and equal to or lower than 250 eV.

(Method for Manufacturing Semiconductor Device)

Referring to FIG. 2, a method for manufacturing semiconductor device 10 of the present embodiment is not particularly limited. However, from the perspective of efficiently manufacturing semiconductor device 10 having high characteristics, it is preferable that the method for manufacturing semiconductor device 10 of the present embodiment includes the steps of forming gate electrode 12 on substrate 11 (FIG. 2(A)), forming gate insulating film 13 on gate electrode 12 as the insulating layer (FIG. 2(B)), forming oxide semiconductor film 14 on gate insulating film 13 as the channel layer (FIG. 2(C)), and forming source electrode 15 and drain electrode 16 on oxide semiconductor film 14 so as not to be in contact with each other (FIG. 2(D)).

1. Step of Forming Gate Electrode

Figure 2A:
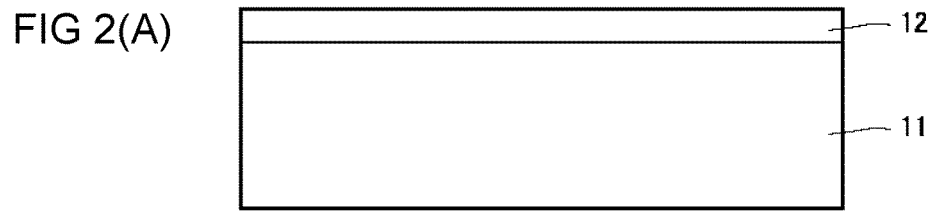
FIGS. 2(A), 2(B), 2(C), and 2(D) (collectively referred to as FIG. 2) are schematic cross-sectional views showing one example of a method for manufacturing the semiconductor device according to one aspect of the present invention.
Figure 2A:

Referring to FIG. 2(A), gate electrode 12 is formed on substrate 11. Although substrate 11 is not particularly limited, a quartz glass substrate, an alkali-free glass substrate, an alkali glass substrate or the like is preferable from the perspective of increasing the transparency, the price stability and the surface smoothness. Although gate electrode 12 is not particularly limited, an Mo electrode, a Ti electrode, a W electrode, an Al electrode, a Cu electrode or the like is preferable from the perspective of high oxidation resistance and low electric resistance. Although a method for forming gate electrode 12 is not particularly limited, the vacuum vapor deposition method, the sputtering method or the like is preferable from the perspective of allowing large-area and uniform formation on a main surface of the substrate.

2. Step of Forming Gate Insulating Film

Figure 2B:
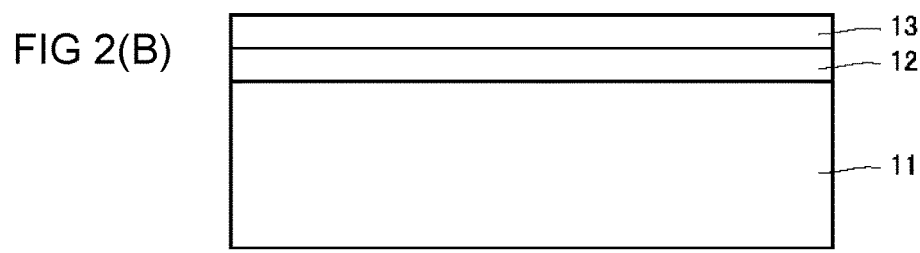
Figure 2B:

Referring to FIG. 2(B), gate insulating film 13 is formed on gate electrode 12 as the insulating layer. Although gate insulating film 13 is not particularly limited, an $SiO_x$ film, an $SiN_y$ film or the like is preferable from the perspective of high insulation property. Although a method for forming gate insulating film 13 is not particularly limited, a plasma CVD (chemical vapor deposition) method or the like is preferable from the perspectives of allowing large-area and uniform formation on the main surface of substrate 11 having the gate electrode formed thereon and of ensuring the insulation property.

3. Step of Forming Oxide Semiconductor Film

Figure 2C:
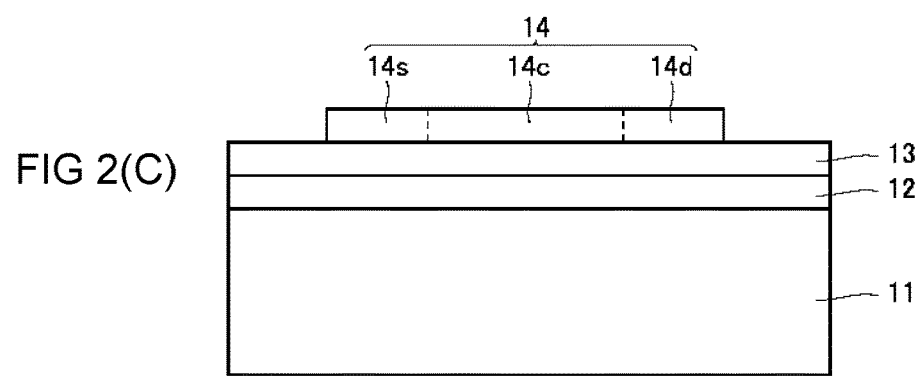
Figure 2C:

Referring to FIG. 2(C), oxide semiconductor film 14 is formed on gate insulating film 13 as the channel layer. From the perspective of manufacturing semiconductor device 10 having high characteristics, oxide semiconductor film 14 is formed by the sputtering method by using the oxide sintered body of the first embodiment as the sputtering target. The sputtering method herein refers to a method for forming the film constituted by the atoms forming the target, by arranging the target and the substrate in a film formation chamber to face each other, applying a voltage to the target, and sputtering a surface of the target with a noble gas ion, thereby releasing the atoms forming the target from the target and depositing the atoms on the substrate (also including the substrate having the gate electrode and the gate insulating film formed thereon as described above).

4. Step of Forming Source Electrode and Drain Electrode

Figure 2D:
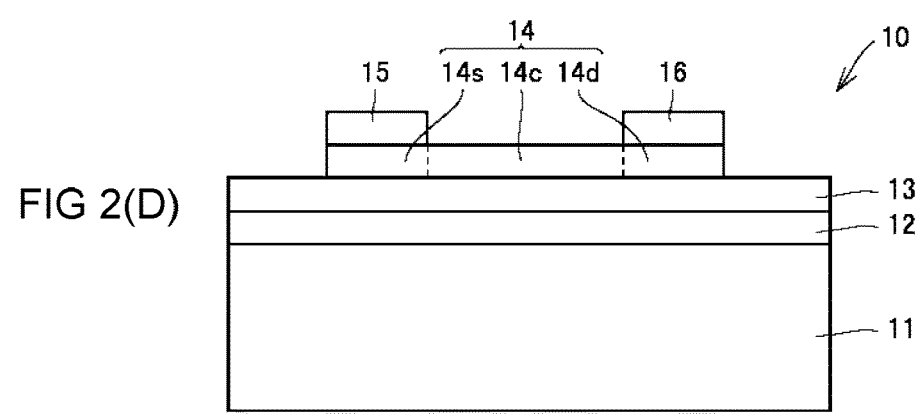

Referring to FIG. 2(D), source electrode 15 and drain electrode 16 are formed on oxide semiconductor film 14 so as not to be in contact with each other. Although source electrode 15 and drain electrode 16 are not particularly limited, an Mo electrode, a Ti electrode, a W electrode, an Al electrode, a Cu electrode or the like is preferable from the perspective of high oxidation resistance, low electric resistance and low contact electric resistance with oxide semiconductor film 14. Although a method for forming source electrode 15 and drain electrode 16 is not particularly limited, the vacuum vapor deposition method, the sputtering method or the like is preferable from the perspective of allowing large-area and uniform formation on the main surface of substrate 11 having oxide semiconductor film 14 formed thereon. Although a method for forming source electrode 15 and drain electrode 16 so as not to be in contact with each other is not particularly limited, formation by an etching method using a photoresist is preferable from the perspective of allowing large-area and uniform formation of the patterns of source electrode 15 and drain electrode 16 on the main surface of substrate 11 having oxide semiconductor film 14 formed thereon.

The valence of tungsten included in the oxide sintered body of the first embodiment, the sputtering target of the third embodiment, and the oxide semiconductor film in the semiconductor device of the fourth embodiment is measured by the X-ray photoelectron spectroscopy (XPS). The peak of the bonding energy of tungsten 4d5/2 of $WO_3$ having a valence of six appears in a range of 247 eV to 249 eV, and the peak of the bonding energy of tungsten metal and tungsten 4d5/2 of $WO_2$ having a valence of four appears in a range of 243 eV to 244 eV. Therefore, a ratio of tungsten having at least one of valences of six and four can be obtained from intensity areas of the peaks present within these ranges and the peaks present outside these ranges. When a ratio of a total peak intensity area of the valences of six and four to an entire peak intensity area of tungsten is equal to or higher than 70%, it can be determined that tungsten having at least one of valences of six and four is a main component.

From the perspective of increasing the ON current and increasing the ratio of the ON current to the OFF current at low driving voltage in the TFT (thin-film transistor) which is semiconductor device 10 including oxide semiconductor film 14 as the channel layer, it is preferable that tungsten included in the oxide sintered body of the first embodiment, the sputtering target of the third embodiment, and oxide semiconductor film 14 in semiconductor device 10 of the fourth embodiment mainly has a valence of six.

Tungsten having a valence of six can be confirmed based on the fact that the bonding energy of tungsten examined by the X-ray photoelectron spectroscopy is equal to or higher than 245 eV and equal to or lower than 250 eV.

EXAMPLE

Examples 1 to 8

1. Preparation of Powder Raw Materials

A tungsten oxide powder (denoted as "W" in Table 1) having a type and median particle size d50 shown in Table 1 and having a purity of 99.99 mass %, a ZnO powder (denoted as "Z" in Table 1) having median particle size d50 of 1.0 μm and having a purity of 99.99 mass %, and an $In_2O_3$ powder (denoted as "I" in Table 1) having median particle size d50 of 1.0 μm and having a purity of 99.99 mass % were prepared.

2. Preparation of Primary Mixture of Raw Material Powders

First, among the prepared raw material powders, the tungsten oxide powder and the ZnO powder were put into a ball mill, and were pulverized and mixed for 18 hours to prepare a primary mixture of the raw material powders. A molar mixing ratio between the tungsten oxide powder and the ZnO powder was set at tungsten oxide powder:ZnO powder=1:1. Ethanol was used as a dispersion medium at the time of pulverization and mixing described above. The obtained primary mixture of the raw material powders was dried in the atmosphere.

3. Formation of Calcined Powder by Heat-Treating Primary Mixture

Next, the obtained primary mixture of the raw material powders was put into a crucible made of alumina, and was calcined for 8 hours at a temperature of 650° C. in an air atmosphere. From the perspective of making a particle size of a calcined powder as small as possible, a lower calcination temperature is preferable as long as the calcination temperature is a temperature that allows formation of a crystal phase. In this way, the calcined powder including the $ZnWO_4$ type phase as a crystal phase was obtained.

4. Preparation of Secondary Mixture of Raw Material Powders including Calcined Powder Next, the obtained calcined powder was put into a pot together with the $In_2O_3$ powder which was the prepared raw material powder, and further was put into a pulverizing and mixing ball mill, and was pulverized and mixed for 12 hours to prepare a secondary mixture of the raw material powders. A mixing amount of the $In_2O_3$ powder was set such that a molar mixing ratio among the tungsten oxide powder, the ZnO powder and the $In_2O_3$ powder was as shown in Table 1. Ethanol was used as a dispersion medium at the time of pulverization and mixing described above. The obtained mixed powder was dried by spray drying.

5. Formation of Molded Body by Molding Secondary Mixture

Next, the obtained secondary mixture was molded by pressing, and further was pressure-molded at a pressure of 190 MPa in the static water having a room temperature (5° C. to 30° C.) by CIP. A disk-shaped molded body having a diameter of 100 mm and a thickness of about 9 mm was thus obtained.

6. Formation of Oxide Sintered Body by Sintering Molded Body

Next, the obtained molded body was fired for 8 hours under the atmospheric pressure and the air atmosphere at the firing temperatures shown in Examples 1 to 8 in Table 1. An oxide sintered body including a bixbite type crystal phase ($In_2O_3$ type phase) having tungsten and zinc solid-dissolved therein was thus obtained.

7. Evaluation of Properties of Oxide Sintered Body

The crystal phases of the obtained oxide sintered body were identified by obtaining a sample from a part of the oxide sintered body and conducting crystal analysis by a powder X-ray diffraction method. Cu-Kα ray was used as X-ray. The crystal phases present in the oxide sintered body were shown in Table 1.

It was confirmed as follows that the $In_2O_3$ type phase which is the bixbite type crystal phase was a main component in the obtained oxide sintered body. First, the presence of the bixbite type crystal phase and the presence of the crystal phases other than the bixbite type crystal phase were identified by the X-ray diffraction. In some cases, only the bixbite type crystal phase was identified by the X-ray diffraction. When only the bixbite type crystal phase was identified, it was determined that the bixbite type crystal phase was a main component.

When the presence of the bixbite type crystal phase and the presence of the crystal phases other than the bixbite type crystal phase were identified by the X-ray diffraction, it was confirmed as follows that the $In_2O_3$ type phase which is the bixbite type crystal phase was a main component.

A sample was obtained from a part of the oxide sintered body and a surface of the sample was polished to make the surface smooth. Then, by using the SEM-EDX, the surface of the sample was observed by the SEM and a composition ratio of the metal elements of the respective crystal particles was analyzed by the EDX. The crystal particles were grouped in accordance with a tendency of the composition ratio of the metal elements of these crystal particles. Then, the crystal particles could be divided into a group of the crystal particles having a high Zn content rate and a high W content rate, and a group of the crystal particles having a very low Zn content rate and a very low W content rate and having a high In content rate. The group of the crystal particles having a high Zn content rate and a high W content rate was concluded as the crystal phases other than the bixbite type crystal phase, and the group of the crystal particles having a very low Zn content rate and a very low W content rate and having a high In content rate was concluded as the $In_2O_3$ type crystal phase which is the bixbite type crystal phase.

When the ratio of the area of the $In_2O_3$ type crystal phase which is the bixbite type crystal phase to the aforementioned measured surface of the oxide sintered body (the occupancy rate of the bixbite type crystal phase) was equal to or higher than 90%, it was determined that the $In_2O_3$ type crystal phase which is the bixbite type crystal phase was a main component. The oxide sintered bodies in Examples 1 to 8 were all mainly composed of the $In_2O_3$ type crystal phase which is the bixbite type crystal phase.

Contained amounts of indium, zinc and tungsten in the obtained oxide sintered body were measured by the ICP mass spectrometry. Based on these contained amounts, the W content rate (denoted as "W content rate" in Table 2) and the Zn content rate (denoted as "Zn content rate" in Table 2) were calculated in atomic %. The result was shown in Table 2.

An apparent density of the obtained oxide sintered body was obtained by the Archimedes method.

The X-ray photoelectron spectroscopy (XPS) was used as a method for measuring the valence of tungsten included in the obtained oxide sintered body and a sputtering target. The peak of the bonding energy of tungsten 4d5/2 of $WO_3$ having a valence of six appeared in a range of 247 eV to 249 eV, and the peak of the bonding energy of tungsten metal and tungsten 4d5/2 of $WO_2$ having a valence of four appeared in a range of 243 eV to 244 eV. The valence of tungsten identified by the XPS (denoted as "W valence" in Table 2) and the peak position of the bonding energy (denoted as "W bonding energy" in Table 2) were shown in Table 2.

8. Fabrication of Target

The obtained oxide sintered body was processed into a target having a diameter of 3 inches (76.2 mm) and a thickness of 5.0 mm.

9. Fabrication of Semiconductor Device (1) Formation of Gate Electrode

Referring to FIG. 2(A), a synthetic quartz glass substrate of 50 mm×50 mm×0.6 mm in thickness was first prepared as substrate 11, and an Mo electrode having a thickness of 100 nm was formed on substrate 11 as gate electrode 12 by the sputtering method.

(2) Formation of Gate Insulating Film

Referring to FIG. 2(B), an amorphous $SiO_x$ film having a thickness of 200 nm was next formed on gate electrode 12 as gate insulating film 13 by the plasma CVD method.

(3) Formation of Oxide Semiconductor Film

Referring to FIG. 2(C), oxide semiconductor film 14 having a thickness of 35 nm was next formed on gate insulating film 13 by a DC (direct current) magnetron sputtering method by using the target processed from the oxide sintered body in each of Examples 1 to 8. Here, a plane of the target having a diameter of 3 inches (76.2 mm) was a sputtering surface.

Specifically, substrate 11 having aforementioned gate electrode 12 and gate insulating film 13 formed thereon was arranged on a water-cooled substrate holder in a film formation chamber of a sputtering apparatus (not shown) such that gate insulating film 13 was exposed. The aforementioned target was arranged at a distance of 90 mm to face gate insulating film 13. The degree of vacuum in the film formation chamber was set at approximately $6\times10^{-5}$ Pa and the target was sputtered as follows.

First, with a shutter interposed between gate insulating film 13 and the target, a mixed gas of an Ar (argon) gas and an $O_2$ (oxygen) gas was introduced into the film formation chamber until the pressure of 0.5 Pa was reached. A content rate of the 02 gas in the mixed gas was 20 volume %. The DC electric power of 100 W was applied to the target to cause sputtering discharge, and thereby, cleaning (pre-sputtering) of the target surface was performed for 10 minutes.

Next, the DC electric power of 100 W was applied to the same target, and with the atmosphere in the film formation chamber maintained, the aforementioned shutter was removed and oxide semiconductor film 14 was formed on gate insulating film 13. A bias voltage was not particularly applied to the substrate holder and the substrate holder was only water-cooled. At this time, the film formation time was set such that oxide semiconductor film 14 had a thickness of 35 nm. In this way, oxide semiconductor film 14 was formed by the DC (direct current) magnetron sputtering method by using the target processed from the oxide sintered body. This oxide semiconductor film 14 functions as a channel layer in a TFT (thin-film transistor) which is semiconductor device 10.

Next, a part of oxide semiconductor film 14 thus formed was etched to form a source electrode forming portion 14s, a drain electrode forming portion 14d and a channel portion 14c. A size of a main surface of each of source electrode forming portion 14s and drain electrode forming portion 14d was set to be 100 μm×100 μm, and a channel length CL (referring to FIGS. 1(A) and 1(B) and FIG. 2, channel length CL refers to a distance of channel portion 14c between source electrode 15 and drain electrode 16) was set to be 20 μm, and a channel width Cw (referring to FIGS. 1(A) and 1(B) and FIG. 2, channel width Cw refers to a width of channel portion 14c) was set to be 40 μm. 25 channel portions 14c in height and 25 channel portions 14c in width were arranged at intervals of 3 mm within the substrate main surface of 75 mm×75 mm such that 25 thin-film transistors (TFTs) which are the semiconductor devices in height and 25 thin-film transistors in width were arranged at intervals of 3 mm within the substrate main surface of 75 mm×75 mm.

The aforementioned etching of a part of oxide semiconductor film 14 was performed, specifically, by preparing an etching aqueous solution including phosphoric acid, acetic acid and nitric acid at a volume ratio of phosphoric acid:acetic acid:nitric acid=87:10:3, and immersing, in this etching aqueous solution, substrate 11 having gate electrode 12, gate insulating film 13 and oxide semiconductor film 14 formed thereon in this order. At this time, a temperature of the etching aqueous solution was raised to 45° C. in a hot bath.

(4) Formation of Source Electrode and Drain Electrode

Referring to FIG. 2(D), source electrode 15 and drain electrode 16 were next formed on oxide semiconductor film 14 to be separated from each other.

Specifically, a resist (not shown) was applied onto oxide semiconductor film 14 and was exposed and developed such that only the main surfaces of source electrode forming portion 14s and drain electrode forming portion 14d of oxide semiconductor film 14 were exposed. An Mo electrode having a thickness of 100 nm as source electrode 15 and an Mo electrode having a thickness of 100 nm as drain electrode 16 were formed on the main surfaces of source electrode forming portion 14s and drain electrode forming portion 14d of oxide semiconductor film 14, respectively, by the sputtering method so as to be separated from each other. Thereafter, the resist on oxide semiconductor film 14 was peeled off. As for these Mo electrodes as source electrode 15 and drain electrode 16, one source electrode 15 and one drain electrode 16 were arranged for one channel portion 14c such that 25 thin-film transistors (TFTs) which are semiconductor devices 10 in height and 25 thin-film transistors in width were arranged at intervals of 3 mm within the substrate main surface of 75 mm×75 mm.

Next, the obtained TFT which is semiconductor device 10 was heat-treated at 150° C. for one hour in the nitrogen atmosphere.

10. Evaluation of Characteristics of Semiconductor Device

The characteristics of the TFT which is semiconductor device 10 were evaluated as follows. First, a measurement needle was brought into contact with gate electrode 12, source electrode 15 and drain electrode 16. A source-drain voltage $V_{ds}$ of 7 V was applied to between source electrode 15 and drain electrode 16, and a source-gate voltage $V_{gs}$ applied to between source electrode 15 and gate electrode 12 was changed from −10 V to 15 V and a source-drain current Ids at this time was measured. Source-drain current $I_{ds}$ when source-gate voltage $V_{gs}$ was −5 V was defined as the OFF current. A value of the OFF current in each Example was shown in Table 2. In the section of "OFF current" in Table 2, "E-12" represents "$10^{-12}$", for example. Source-drain current Ids when source-gate voltage $V_{gs}$ was 15 V was defined as the ON current and a ratio of a value of the ON current to a value of the OFF current (ON current/OFF current ratio) was obtained. This was shown in Table 2. In the section of "ON current/OFF current ratio" in Table 2, the nine digits represent equal to or higher than $1\times10^9$ and lower than $1\times10^{10}$, the eight digits represent equal to or higher than $1\times10^8$ and lower than $1\times10^9$, the seven digits represent equal to or higher than $1\times10^7$ and lower than $1\times10^8$, the six digits represent equal to or higher than $1\times10^6$ and lower than $1\times10^7$, and the four digits represent equal to or higher than $1\times10^4$ and lower than $1\times10^5$.

Contained amounts of indium, zinc and tungsten in oxide semiconductor film 14 of the TFT were measured by the RBS (Rutherford backscattering analysis). Based on these contained amounts, the W content rate and the Zn content rate were calculated in atomic %. Based on these contained amounts, the W/Zn atomic ratio was also calculated. The result was shown in Table 2.

The valence of tungsten included in obtained oxide semiconductor film 14 was measured by the X-ray photoelectron spectroscopy (XPS). The peak of the bonding energy of tungsten 4d5/2 of $WO_3$ having a valence of six appeared in a range of 247 eV to 249 eV, and the peak of the bonding energy of tungsten metal and tungsten 4d5/2 of $WO_2$ having a valence of four appeared in a range of 243 eV to 244 eV. The valence of tungsten identified by the XPS (denoted as "W valence" in Table 2) and the peak position of the bonding energy (denoted as "W bonding energy" in Table 2) were shown in Table 2.

TABLE 1

| | Raw Material Powders | | | | | | | | Oxide Sintered Body | | | |
|---|---|---|---|---|---|---|---|---|---|---|---|---|
| | Molar Mixing Ratio | | | | | | W Particle Size μm | Calcination Temperature ° C. | Calcined Complex Oxide Type | Sintering Temperature ° C. | Apparent Density (g/cm³) | Crystal Phase Present | Presence or Absence of Solid Solution |
| | W (%) | Z (%) | I (%) | M (%) | W Type | M Type | | | | | | | |
| Example 1 | 3.1 | 3.1 | 93.8 | 0.0 | $WO_{2.72}$ | none | 0.8 | 650 | $ZnWO_4$ | 1190 | 6.82 | $In_2O_3$ | present |
| Example 2 | 6.2 | 6.2 | 87.6 | 0.0 | $WO_2$ | none | 0.8 | 650 | $ZnWO_4$ | 1175 | 6.84 | $In_2O_3$ | present |

TABLE 1-continued

| | Raw Material Powders | | | | | | | | | Oxide Sintered Body | | | |
|---|---|---|---|---|---|---|---|---|---|---|---|---|---|
| | Molar Mixing Ratio | | | | | | W Particle Size μm | Calcination Temperature °C. | Calcined Complex Oxide Type | Sintering Temperature °C. | Apparent Density (g/cm³) | Crystal Phase Present | Presence or Absence of Solid Solution |
| | W (%) | Z (%) | I (%) | M (%) | W Type | M Type | | | | | | | |
| Example 3 | 11.2 | 11.2 | 77.6 | 0.0 | WO₃ | none | 0.8 | 650 | ZnWO₄ | 1175 | 6.86 | In₂O₃ | present |
| Example 4 | 14.3 | 14.3 | 71.4 | 0.0 | WO₃ | none | 0.8 | 650 | ZnWO₄ | 1150 | 6.87 | In₂O₃, ZnWO₄ | present |
| Example 5 | 17.3 | 17.3 | 65.4 | 0.0 | WO₃ | none | 0.8 | 650 | ZnWO₄ | 1150 | 6.89 | In₂O₃, ZnWO₄ | present |
| Example 6 | 24.6 | 24.6 | 50.8 | 0.0 | WO₃ | none | 0.8 | 650 | ZnWO₄ | 1150 | 6.92 | In₂O₃, ZnWO₄ | present |
| Example 7 | 20.8 | 20.8 | 58.4 | 0.0 | WO₃ | none | 0.8 | 650 | ZnWO₄ | 1100 | 6.90 | In₂O₃, ZnWO₄ | present |
| Example 8 | 30.4 | 30.4 | 39.2 | 0.0 | WO₃ | none | 0.8 | 650 | ZnWO₄ | 1100 | 6.94 | In₂O₃, ZnWO₄ | present |
| Example 9 | 4.5 | 3.0 | 92.5 | 0.0 | WO₃ | none | 0.8 | 950 | Zn₂W₃O₈ | 1190 | 6.62 | In₂O₃ | present |
| Example 10 | 6.2 | 4.1 | 89.7 | 0.0 | WO₃ | none | 0.8 | 950 | Zn₂W₃O₈ | 1190 | 6.64 | In₂O₃ | present |
| Example 11 | 9.1 | 6.1 | 84.8 | 0.0 | WO₃ | none | 0.8 | 950 | Zn₂W₃O₈ | 1175 | 6.74 | In₂O₃ | present |
| Example 12 | 14.5 | 9.7 | 75.8 | 0.0 | WO₃ | none | 0.8 | 950 | Zn₂W₃O₈ | 1150 | 6.78 | In₂O₃, Zn₂W₃O₈ | present |
| Example 13 | 4.8 | 4.8 | 86.6 | 3.8 | WO₂.₇₂ | Al | 0.8 | 650 | ZnWO₄ | 1175 | 6.83 | In₂O₃ | present |
| Example 14 | 4.8 | 4.8 | 88.9 | 1.5 | WO₂.₇₂ | Cr | 0.8 | 650 | ZnWO₄ | 1175 | 6.82 | In₂O₃ | present |
| Example 15 | 4.8 | 4.8 | 89.9 | 0.5 | WO₂.₇₂ | Ga | 0.8 | 650 | ZnWO₄ | 1175 | 6.81 | In₂O₃ | present |
| Example 16 | 4.8 | 4.8 | 88.0 | 2.4 | WO₂.₇₂ | Ga | 0.8 | 650 | ZnWO₄ | 1175 | 6.82 | In₂O₃ | present |
| Example 17 | 4.8 | 4.8 | 86.1 | 4.3 | WO₂.₇₂ | Ga | 0.8 | 650 | ZnWO₄ | 1175 | 6.85 | In₂O₃ | present |
| Example 18 | 4.8 | 4.8 | 89.9 | 0.5 | WO₂.₇₂ | Hf | 0.8 | 650 | ZnWO₄ | 1175 | 6.79 | In₂O₃ | present |
| Example 19 | 4.8 | 4.8 | 89.4 | 1.0 | WO₂.₇₂ | V | 0.8 | 650 | ZnWO₄ | 1175 | 6.81 | In₂O₃ | present |
| Example 20 | 4.8 | 4.8 | 88.9 | 1.5 | WO₂.₇₂ | Nb | 0.8 | 650 | ZnWO₄ | 1175 | 6.78 | In₂O₃ | present |
| Example 21 | 4.8 | 4.8 | 88.4 | 2.0 | WO₂.₇₂ | Zr | 0.8 | 650 | ZnWO₄ | 1175 | 6.82 | In₂O₃ | present |
| Example 22 | 4.8 | 4.8 | 86.6 | 3.8 | WO₂.₇₂ | Mo | 0.8 | 650 | ZnWO₄ | 1175 | 6.80 | In₂O₃ | present |
| Example 23 | 4.8 | 4.8 | 87.5 | 2.9 | WO₂.₇₂ | Ta | 0.8 | 650 | ZnWO₄ | 1175 | 6.78 | In₂O₃ | present |
| Example 24 | 4.8 | 4.8 | 89.4 | 1.0 | WO₂.₇₂ | Bi | 0.8 | 650 | ZnWO₄ | 1175 | 6.81 | In₂O₃ | present |
| Comparative Example 1 | 7.1 | 7.1 | 85.8 | 0.0 | WO₃ | none | 4.5 | none | none | 1175 | 5.41 | In₂O₃ | present |
| Comparative Example 2 | 6.9 | 6.9 | 86.2 | 0.0 | WO₃ | none | 0.09 | none | none | 1175 | 4.30 | In₂O₃ | present |
| Comparative Example 3 | 7.0 | 7.0 | 86.0 | 0.0 | WO₃ | none | 0.8 | none | none | 1175 | 6.43 | In₂O₃ | present |

TABLE 2

| | Oxide Sintered Body | | | | | Oxide Semiconductor Film | | | | | TFT Characteristics | |
|---|---|---|---|---|---|---|---|---|---|---|---|---|
| | W Content Rate (at. %) | Zn Content Rate (at. %) | M Content Rate (at. %) | W Valence | W Bonding Energy (eV) | W Content Rate (at. %) | Zn Content Rate (at. %) | W/Zn Atomic Ratio | W Valence | W Bonding Energy (eV) | OFF Current (A) | ON Current/OFF Current Ratio (digit) |
| Example 1 | 1.4 | 1.4 | 0 | 6 | 247.3 | 1.4 | 1.3 | 1.8 | 6 | 247.5 | E-12 | 8 |
| Example 2 | 3.2 | 3.0 | 0 | 6 | 247.8 | 2.9 | 1.5 | 1.9 | 6 | 248 | E-13 | 7 |
| Example 3 | 8.2 | 8.3 | 0 | 6 | 248 | 7.4 | 4.2 | 1.8 | 6 | 248.2 | E-13 | 6 |
| Example 4 | 10.3 | 10.1 | 0 | 6 | 246.4 | 9.3 | 5.1 | 1.8 | 6 | 246.6 | E-13 | 6 |
| Example 5 | 14.3 | 14.5 | 0 | 6 | 245.9 | 12.9 | 7.3 | 1.8 | 6 | 246.1 | E-13 | 6 |
| Example 6 | 20.6 | 20.8 | 0 | 6 | 245.6 | 18.5 | 10.4 | 1.8 | 6 | 245.8 | E-13 | 6 |
| Example 7 | 16.8 | 17.0 | 0 | 6, 4 | 244.6 | 15.1 | 8.5 | 1.8 | 6, 4 | 244.8 | E-13 | 6 |
| Example 8 | 26.4 | 26.9 | 0 | 6, 4 | 243.8 | 23.8 | 13.5 | 1.8 | 6, 4 | 244 | E-13 | 6 |
| Example 9 | 1.6 | 1.6 | 0 | 4 | 243 | 1.4 | 1.3 | 2.7 | 4 | 243.2 | E-13 | 8 |
| Example 10 | 3.2 | 2.1 | 0 | 4 | 242.2 | 2.9 | 1.1 | 2.7 | 4 | 242.4 | E-13 | 7 |
| Example 11 | 6.1 | 4.1 | 0 | 6, 4 | 244.2 | 5.5 | 2.0 | 2.7 | 6, 4 | 244.4 | E-13 | 6 |
| Example 12 | 10.5 | 7.0 | 0 | 6, 4 | 244 | 9.5 | 3.5 | 2.7 | 6, 4 | 244.2 | E-13 | 6 |
| Example 13 | 0.8 | 0.8 | 7.2 | 6 | 246.6 | 0.7 | 0.4 | 1.8 | 6 | 247 | E-13 | 8 |
| Example 14 | 0.8 | 0.8 | 2.0 | 6 | 247.1 | 0.7 | 0.4 | 1.8 | 6 | 247.5 | E-13 | 8 |
| Example 15 | 0.8 | 0.8 | 0.4 | 6 | 247.4 | 0.7 | 0.4 | 1.8 | 6 | 247.8 | E-13 | 9 |
| Example 16 | 0.8 | 0.8 | 4.3 | 6 | 247.6 | 0.7 | 0.4 | 1.8 | 6 | 248 | E-13 | 8 |
| Example 17 | 0.8 | 0.8 | 8.1 | 6 | 246.3 | 0.7 | 0.4 | 1.8 | 6 | 246.7 | E-13 | 8 |
| Example 18 | 0.8 | 0.8 | 0.7 | 6 | 247.0 | 0.7 | 0.4 | 1.8 | 6 | 247.4 | E-13 | 8 |
| Example 19 | 0.8 | 0.8 | 0.4 | 6 | 246.5 | 0.7 | 0.4 | 1.8 | 6 | 246.9 | E-13 | 8 |
| Example 20 | 0.8 | 0.8 | 2.2 | 6 | 246.8 | 0.7 | 0.4 | 1.8 | 6 | 247.2 | E-12 | 9 |
| Example 21 | 0.8 | 0.8 | 1.8 | 6 | 247.4 | 0.7 | 0.4 | 1.8 | 6 | 247.8 | E-12 | 9 |
| Example 22 | 0.8 | 0.8 | 3.4 | 6 | 247.7 | 0.7 | 0.4 | 1.8 | 6 | 248.1 | E-12 | 9 |

TABLE 2-continued

| | Oxide Sintered Body | | | | | Oxide Semiconductor Film | | | | | TFT Characteristics | |
|---|---|---|---|---|---|---|---|---|---|---|---|---|
| | W Content Rate (at. %) | Zn Content Rate (at. %) | M Content Rate (at. %) | W Valence | W Bonding Energy (eV) | W Content Rate (at. %) | Zn Content Rate (at. %) | W/Zn Atomic Ratio | W Valence | W Bonding Energy (eV) | OFF Current (A) | ON Current/OFF Current Ratio (digit) |
| Example 23 | 0.8 | 0.8 | 2.0 | 6 | 246.5 | 0.7 | 0.4 | 1.8 | 6 | 246.9 | E-12 | 9 |
| Example 24 | 0.8 | 0.8 | 1.6 | 6 | 247.3 | 0.7 | 0.4 | 1.8 | 6 | 247.7 | E-12 | 9 |
| Comparative Example 1 | 3.1 | 2.9 | 0 | 3 | 241.1 | 3.0 | 1.6 | 1.9 | 3 | 241.4 | E-9 | 4 |
| Comparative Example 2 | 2.9 | 2.8 | 0 | 3 | 241.3 | 2.8 | 1.4 | 2.0 | 3 | 241.5 | E-9 | 4 |
| Comparative Example 3 | 3.0 | 3.2 | 0 | 3 | 240.8 | 3.1 | 1.4 | 2.2 | 3 | 241.1 | E-9 | 4 |

Examples 9 to 12

1. Preparation of Powder Raw Materials

A tungsten oxide powder (denoted as "W" in Table 1) having a type and median particle size d50 shown in Table 1 and having a purity of 99.99 mass %, a ZnO powder (denoted as "Z" in Table 1) having median particle size d50 of 1.0 μm and having a purity of 99.99 mass %, and an $In_2O_3$ powder (denoted as "I" in Table 1) having median particle size d50 of 1.0 μm and having a purity of 99.99 mass % were prepared.

2. Preparation of Primary Mixture of Raw Material Powders

First, among the prepared raw material powders, the tungsten oxide powder and the ZnO powder were put into a ball mill, and were pulverized and mixed for 18 hours to prepare a primary mixture of the raw material powders. A molar mixing ratio between the tungsten oxide powder and the ZnO powder was set at tungsten oxide powder:ZnO powder=3:2. Ethanol was used as a dispersion medium at the time of pulverization and mixing described above. The obtained primary mixture of the raw material powders was dried in the atmosphere.

3. Formation of Calcined Powder by Calcining Primary Mixture

Next, the obtained primary mixture of the raw material powders was put into a crucible made of alumina, and was calcined for 5 hours at a temperature of 950° C. in an air atmosphere. In this way, a calcined powder including the $Zn_2W_3O_8$ type phase as a crystal phase was obtained.

4. Preparation of Secondary Mixture of Raw Material Powders including Calcined Powder Next, the obtained calcined powder was put into a pot together with the $In_2O_3$ powder which was the prepared raw material powder, and further was put into a pulverizing and mixing ball mill, and was pulverized and mixed for 12 hours to prepare a secondary mixture of the raw material powders. A mixing amount of the $In_2O_3$ powder was set such that a molar mixing ratio among the tungsten oxide powder, the ZnO powder and the $In_2O_3$ powder was as shown in Table 1. Ethanol was used as a dispersion medium at the time of pulverization and mixing described above. The obtained mixed powder was dried by spray drying.

5. Formation of Molded Body by Molding Secondary Mixture

Next, by using the obtained secondary mixture, a disk-shaped molded body having a diameter of 100 mm and a thickness of about 9 mm was obtained similarly to the case of Examples 1 to 8.

6. Formation of Oxide Sintered Body by Sintering Molded Body

Next, the obtained molded body was fired for 8 hours in the air atmosphere at the firing temperatures shown in Examples 9 to 12 in Table 1. An oxide sintered body including a bixbite type crystal phase ($In_2O_3$ type phase) having tungsten and zinc solid-dissolved therein was thus obtained.

7. Evaluation of Properties of Oxide Sintered Body

Similarly to Examples 1 to 8, the crystal phases were identified by conducting crystal analysis by the powder X-ray diffraction method. The crystal phases present in the oxide sintered body were shown in Table 1. In addition, by the method similar to that in Examples 1 to 8, it was confirmed that each of the oxide sintered bodies in Examples 9 to 12 was mainly composed of the $In_2O_3$ type crystal phase which is the bixbite type crystal phase.

In addition, similarly to Examples 1 to 8, the W content rate and the Zn content rate in the oxide sintered body, the apparent density, the valence of tungsten, and the W bonding energy were measured. The result was shown in Table 2.

8. Fabrication of Target

Similarly to the case of Examples 1 to 8, the obtained oxide sintered body was processed into a target having a diameter of 3 inches (76.2 mm) and a thickness of 5.0 mm.

9. Fabrication of Semiconductor Device

Similarly to the case of Examples 1 to 8, a TFT which is a semiconductor device was fabricated.

10. Evaluation of Characteristics of Semiconductor Device

Similarly to the case of Examples 1 to 8, the OFF current and the ratio of the value of the ON current to the value of the OFF current were measured. The result was shown in Table 2.

In addition, similarly to Examples 1 to 8, the W content rate and the Zn content rate in oxide semiconductor film 14, the W/Zn atomic ratio, the valence of tungsten included in oxide semiconductor film 14, and the W bonding energy of tungsten included in oxide semiconductor film 14 were measured. The result was shown in Table 2.

Examples 13 to 24

An oxide sintered body including a bixbite type crystal phase ($In_2O_3$ type phase) that has tungsten and zinc solid-dissolved therein and further includes element M was fabricated similarly to Examples 1 to 12, except that an oxide powder ($Al_2O_3$, $TiO_2$, $Cr_2O_3$, $Ga_2O_3$, $HfO_2$, $SiO_2$, $V_2O_5$, $Nb_2O_3$, $ZrO_2$, $MoO_2$, $Ta_2O_3$, $Bi_2O_3$) including element M shown in Table 1 was added as a raw material powder, in addition to the calcined powder and the $In_2O_3$ powder, when the secondary mixture of the raw material powders was prepared. The M content rate in the oxide sintered body was shown in Table 2. Each of the oxide sintered bodies in Examples 13 to 24 was mainly composed of the $In_2O_3$ type crystal phase which is the bixbite type crystal phase. The obtained oxide sintered body was processed into a target, and a TFT which is a semiconductor device including an oxide semiconductor film formed by the DC magnetron sputtering method by using this target was fabricated similarly to Examples 1 to 12.

The properties of the obtained oxide sintered body and oxide semiconductor film as well as the characteristics of the TFT which is the semiconductor device were shown in Tables 1 and 2. The methods for measuring the properties and the characteristics were similar to those in Examples 1 to 12.

Comparative Examples 1 to 3

An oxide sintered body was fabricated similarly to Examples 1 to 8 or Examples 9 to 12, except that when the oxide sintered body was fabricated, the mixture of the raw material powders was prepared and thereafter the mixture of the raw material powders was molded and sintered without being calcined. The obtained oxide sintered body was processed into a target, and a TFT which is a semiconductor device including an oxide semiconductor film formed by the DC magnetron sputtering method by using this target was fabricated similarly to Examples. Since the mixture of the raw material powders was molded and sintered without being calcined, it was confirmed that a complex oxide crystal phase was not generated. Each of the oxide sintered bodies in Comparative Examples 1 to 3 had an apparent density of equal to or lower than 6.5 g/cm$^3$. Comparative Examples 1 to 3 are different from one another in terms of a molar mixing ratio among the $WO_{2.72}$ powder or the $WO_2$ powder, the ZnO powder or the $SnO_2$ powder, and the $In_2O_3$ powder.

The properties of the obtained oxide sintered body and oxide semiconductor film as well as the characteristics of the TFT which is the semiconductor device were shown in Table 2. The methods for measuring the properties and the characteristics were similar to those in Examples.

Examples 25 to 28

An oxide sintered body including a bixbite type crystal phase ($In_2O_3$ type phase) that has tungsten and zinc solid-dissolved therein and further includes element M was fabricated similarly to Examples 1 to 12, except that an oxide powder ($TiO_2$, $SiO_2$) including element M shown in Table 3 was added as a raw material powder, in addition to the calcined powder and the $In_2O_3$ powder, when the secondary mixture of the raw material powders was prepared. The M content rate in the oxide sintered body and an atomic ratio of element M to In (M/In ratio) were shown in Table 3. Each of the oxide sintered bodies in Examples 25 to 28 was mainly composed of the $In_2O_3$ type crystal phase which is the bixbite type crystal phase. The obtained oxide sintered body was processed into a target, and a TFT which is a semiconductor device including an oxide semiconductor film formed by the DC magnetron sputtering method by using this target was fabricated similarly to Examples 1 to 12.

The properties of the obtained oxide sintered body and oxide semiconductor film as well as the characteristics of the TFT which is the semiconductor device were shown in Table 3. The methods for measuring the properties and the characteristics were similar to those in Examples 1 to 12.

In addition, as for Examples 25 to 28, the electric resistivity of the oxide semiconductor film was measured in accordance with the following procedure. First, the oxide semiconductor film was formed similarly to the method described in "9. Fabrication of Semiconductor Device, (3) Formation of Oxide Semiconductor Film" for Examples 1 to 8 (etching after formation of the oxide semiconductor film was not performed). The electric resistivity of the obtained oxide semiconductor film was measured by the four-terminal method. At this time, Mo electrodes were formed as electrode members by the sputtering method such that an interval between the electrodes was 10 mm. Then, a voltage between the inner electrodes was measured while a voltage of −40 V to +40 V was swept to the outer electrodes and a current was passed. The electric resistivity was thus calculated. The result was shown in Table 3. In order to set the electric resistivity to be equal to or higher than 1×10$^2$ Ωcm that allowed use as an oxide semiconductor, it was preferable that the ratio of Si/In atomic number was lower than 0.007 when added element M was Si, and it was preferable that the ratio of Ti/In atomic number was lower than 0.004 when added element M was Ti. As the electric resistivity increased, the OFF current tended to decrease and the TFT characteristics tended to be enhanced. When the electric resistivity was lower than 1×10$^2$ Ωcm, the OFF current tended to be high.

TABLE 3

| | Raw Material Powders | | | | | | | Calcination Temperature °C. | Calcined Complex Oxide Type | | Oxide Sintered Body | | |
|---|---|---|---|---|---|---|---|---|---|---|---|---|---|
| | Molar Mixing Ratio | | | | | | W Particle Size μm | | | Sintering Temperature °C. | Apparent Density (g/cm$^3$) | Crystal Phase Present | Presence or Absence of Solid Solution |
| | W (%) | Z (%) | I (%) | M (%) | W Type | M Type | | | | | | | |
| Example 25 | 4.8 | 4.8 | 88.0 | 2.4 | $WO_{2.72}$ | Ti | 0.8 | 650 | $ZnWO_4$ | 1175 | 6.85 | $In_2O_3$ | present |
| Example 26 | 4.8 | 4.8 | 89.8 | 0.6 | $WO_{2.72}$ | Ti | 0.8 | 650 | $ZnWO_4$ | 1175 | 6.85 | $In_2O_3$ | present |
| Example 27 | 4.8 | 4.8 | 89.4 | 1.0 | $WO_{2.72}$ | Si | 0.8 | 650 | $ZnWO_4$ | 1175 | 6.80 | $In_2O_3$ | present |
| Example 28 | 4.8 | 4.8 | 90.2 | 0.2 | $WO_{2.72}$ | Si | 0.8 | 650 | $ZnWO_4$ | 1175 | 6.85 | $In_2O_3$ | present |

TABLE 3-continued

| | Oxide Sintered Body | | | | | | Oxide Semiconductor Film | | | | | TFT Characteristics | | |
|---|---|---|---|---|---|---|---|---|---|---|---|---|---|---|
| | W Content Rate (at. %) | Zn Content Rate (at. %) | M Content Rate (at. %) | M/In Atomic Ratio | W Valence | W Bonding Energy (eV) | W Content Rate (at. %) | Zn Content Rate (at. %) | W/Zn Atomic Ratio | W Valence | W Bonding Energy (eV) | OFF Current (A) | ON Current/OFF Current Ratio (digit) | Electric Resistivity ($\Omega$m) |
| Example 25 | 0.8 | 0.8 | 1.2 | 0.012 | 6 | 246.1 | 0.7 | 0.4 | 1.8 | 6 | 246.5 | $6 \times 10^{-8}$ | 8 | 10 |
| Example 26 | 0.8 | 0.8 | 0.3 | 0.003 | 6 | 246.1 | 0.7 | 0.4 | 1.8 | 6 | 246.5 | $1 \times 10^{-13}$ | 8 | $8 \times 10^2$ |
| Example 27 | 0.8 | 0.8 | 0.5 | 0.005 | 6 | 245.8 | 0.7 | 0.4 | 1.8 | 6 | 246.2 | $1 \times 10^{-13}$ | 8 | $8 \times 10^2$ |
| Example 28 | 0.8 | 0.8 | 1.0 | 0.010 | 6 | 246.1 | 0.7 | 0.4 | 1.8 | 6 | 246.5 | $6 \times 10^{-8}$ | 8 | 10 |

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

10 semiconductor device, 11 substrate, 12 gate electrode, 13 gate insulating film, 14 oxide semiconductor film, 14c channel portion, 14d drain electrode forming portion, 14s source electrode forming portion, 15 source electrode, 16 drain electrode.

The invention claimed is:

1. An oxide sintered body comprising indium, tungsten and zinc, wherein
    said oxide sintered body includes a bixbite type crystal phase and has an apparent density of higher than 6.5 g/cm³ and equal to or lower than 7.1 g/cm³,
    a content rate of tungsten to a total of indium, tungsten and zinc in said oxide sintered body is higher than 1.2 atomic % and lower than 30 atomic %,
    a content rate of zinc to the total of indium, tungsten and zinc in said oxide sintered body is higher than 1.2 atomic % and lower than 30 atomic %, and
    wherein said oxide sintered body further comprises at least one type of element selected from the group consisting of aluminum, titanium, chromium, gallium, hafnium, zirconium, silicon, molybdenum, vanadium, niobium, tantalum, and bismuth,
    wherein a content rate of said element to a total of indium, tungsten, zinc, and said element in said oxide sintered body is equal to or higher than 0.1 atomic % and equal to or lower than 10 atomic %.

2. The oxide sintered body according to claim 1, wherein said bixbite type crystal phase includes indium oxide as a main component, and includes tungsten and zinc solid-dissolved in at least a part of said bixbite type crystal phase.

3. The oxide sintered body according to claim 1, wherein an atomic ratio of silicon to indium in said oxide sintered body is lower than 0.007.

4. The oxide sintered body according to claim 1, wherein an atomic ratio of titanium to indium in said oxide sintered body is lower than 0.004.

5. The oxide sintered body according to claim 1, comprising tungsten having at least one of valences of six and four.

6. The oxide sintered body according to claim 1, comprising tungsten whose bonding energy measured by X-ray photoelectron spectroscopy is equal to or higher than 245 eV and equal to or lower than 250 eV.

7. A sputtering target comprising the oxide sintered body as recited in claim 1.

* * * * *